United States Patent
Noh et al.

(10) Patent No.: US 12,302,660 B2
(45) Date of Patent: May 13, 2025

(54) IMAGE SENSOR INCLUDING REFLECTIVE STRUCTURE INCLUDING A REFLECTIVE STRUCTURE

(71) Applicant: SAMSUNG ELECTRONICS CO., LTD., Suwon-si (KR)

(72) Inventors: Jonghyeon Noh, Hwaseong-si (KR); Kook Tae Kim, Hwaseong-si (KR); Jingyun Kim, Seogwipo-si (KR); Miseon Park, Hwaseong-si (KR); Jaewoong Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/952,479

(22) Filed: Sep. 26, 2022

(65) Prior Publication Data
US 2023/0170372 A1   Jun. 1, 2023

(30) Foreign Application Priority Data

Nov. 29, 2021   (KR) .................. 10-2021-0167022

(51) Int. Cl.
*H01L 27/146* (2006.01)
*H10F 39/00* (2025.01)

(52) U.S. Cl.
CPC ....... *H10F 39/807* (2025.01); *H10F 39/8053* (2025.01); *H10F 39/8063* (2025.01); *H10F 39/8067* (2025.01); *H10F 39/811* (2025.01)

(58) Field of Classification Search
CPC ......... H01L 27/14643; H01L 27/14629; H01L 27/1464; H10F 39/807; H10F 39/00; H10F 39/8053; H10F 39/8063; H10F 39/8067; H10F 39/811; H10F 39/1865; H10F 30/2635; H10F 30/26; H10F 30/2218; H10F 30/2255; H10F 10/161; H10F 10/163; H10F 10/169; H10F 19/75; H10F 19/904; H10F 19/90; A23B 2/70; A23B 2/721;
(Continued)

(56) References Cited

U.S. PATENT DOCUMENTS 7,154,136 B2   12/2006   Cole et al.
9,130,072 B1   9/2015   Chen et al.
(Continued)

*Primary Examiner* — Nikolay K Yushin
(74) *Attorney, Agent, or Firm* — MORGAN, LEWIS & BOCKIUS LLP

(57) ABSTRACT

An image sensor includes: a substrate including a first surface and a second surface; an interlayer dielectric layer covering the first surface; and a pixel separation part disposed its the substrate, wherein the pixel separation part divides a plurality of unit pixels from each other, wherein the pixel separation part includes: a conductive structure that extends from the first surface toward the second surface; a first reflective structure disposed between the conductive structure and the substrate; and a front-side buried pattern disposed between the conductive structure and the interlayer dielectric layer and between the first reflective structure and the interlayer dielectric layer, wherein the first reflective structure includes first reflective liners and second reflective liners that are alternately disposed in a direction toward the conductive structure from the substrate, wherein a refractive index of the first reflective liners is different from a refractive index of the second reflective liners.

20 Claims, 28 Drawing Sheets

(58) Field of Classification Search
CPC ......... A23B 2/792; A23B 70/20; A23B 99/00; A61K 40/4225; A61K 40/42; A61K 40/405; A61K 40/4238; G08G 5/51; G08G 5/26; H02K 15/0433; H02K 15/043; H02K 15/273
See application file for complete search history.

(56) References Cited

U.S. PATENT DOCUMENTS

| | | |
|---|---|---|
| 10,157,949 B2 | 12/2018 | Cheng et al. |
| 10,515,992 B2 | 12/2019 | Kim et al. |
| 10,700,114 B2 | 6/2020 | Honda et al. |
| 10,790,322 B1 | 9/2020 | Wang et al. |
| 10,797,090 B2 | 10/2020 | Perkins et al. |
| 2013/0070131 A1* | 3/2013 | Ohkubo ................ H10F 39/807 348/294 |
| 2016/0284746 A1 | 9/2016 | Fukase et al. |
| 2021/0193704 A1 | 6/2021 | Sun |

* cited by examiner

IMAGE SENSOR INCLUDING REFLECTIVE STRUCTURE INCLUDING A REFLECTIVE STRUCTURE

CROSS-REFERENCE TO RELATED APPLICATION

This U.S. nonprovisional application claims priority under 35 U.S.C. § 119 to Korean Patent Application No. 10-2021-60167022 filed on Nov. 29, 2021 in the Korean Intellectual Property Office, the disclosure of which is incorporated by reference herein in its entirety.

TECHNICAL FIELD

The present inventive concept relates to an image sensor, and more particularly, to an image sensor including a reflective structure.

DISCUSSION OF THE RELATED ART

An image sensor is a semiconductor device that transforms optical images into electrical signals. The image sensor may be classified as a charge coupled device (CCD) type or a complementary metal oxide semiconductor (CMOS) type. The CIS (CMOS image sensor) is a CMOS type image sensor. The CIS may typically include a plurality of two-dimensionally arranged pixels. Each of the pixels includes a photodiode (PD). The photodiode may transform incident light into electrical signals.

SUMMARY

Some exemplary embodiments of the present inventive concept provide an image sensor with increased photosensitivity and improved dark current characteristics.

The object of the present inventive concept is not limited to the mentioned above, and other objects which have not been mentioned above will be clearly understood to those skilled in the art from the following description.

According to an exemplary embodiment of the present inventive concept, an image sensor includes: a substrate including a first surface and a second surface that are opposite to each other; an interlayer dielectric layer covering the first surface; and a pixel separation part disposed in the substrate, wherein the pixel separation part divides a plurality of unit pixels from each other, wherein the pixel separation part includes: a conductive structure that extends from the first surface of the substrate toward the second surface of the substrate; a first reflective structure disposed between the conductive structure and the substrate; and a front-side buried pattern disposed between the conductive structure and the interlayer dielectric layer and between the first reflective structure and the interlayer dielectric layer, wherein the first reflective structure includes a plurality of first reflective liners and a plurality of second reflective liners that are alternately disposed in a direction toward the conductive structure from a lateral surface of the substrate, wherein a refractive index of the first reflective liners is different from a refractive index of the second reflective liners.

According to an exemplary embodiment of the present inventive concept, an image sensor includes: a substrate including a first surface and a second surface that are opposite to each other, wherein the substrate includes a plurality of unit pixels; a pixel separation part disposed in the substrate, wherein the pixel separation part divides the unit pixels from each other; a device isolation part adjacent to the first surface of the substrate and limiting an active section; a plurality of photoelectric conversion elements disposed in the substrate and on corresponding unit pixels; a transfer gate disposed on the first surface of the substrate and on each of the unit pixels; a fixed charge layer disposed on the second surface of the substrate; a color filter array disposed on the fixed charge layer; and a microlens array disposed on the color filter array, wherein the pixel separation part includes: a conductive structure extending from the first surface of the substrate toward the second surface of the substrate; a first reflective structure disposed between the conductive structure and the substrate; and a front-side buried pattern disposed on the conductive structure and the first reflective structure, wherein the first reflective structure includes a plurality of first reflective liners and a plurality of second reflective liners that are alternately disposed in a direction toward the conductive structure from a lateral surface of the substrate, wherein a dielectric constant of the second reflective liners is greater than a dielectric constant of the first reflective liners, wherein the number of the first reflective liners is two to ten, and wherein the number of the second reflective liners is two to ten.

According to an exemplary embodiment of the present inventive concept, an image sensor includes: a substrate including a first surface and a second surface that are opposite to each other, wherein the substrate includes a trench that separates a plurality of unit pixels from each other and extends toward the first surface from the second surface; and a pixel separation part disposed in the trench, wherein the pixel separation part includes: a fixed charge layer disposed on the second surface of the substrate and disposed in the trench; and a first reflective structure covering the fixed charge layer in the trench, wherein the first reflective structure includes a first reflective liner and a second reflective liner that are alternately disposed in a direction toward an inside of the trench from a lateral surface of the substrate, wherein a refractive index of the first reflective liner is different from a refractive index of the second reflective liner.

DETAILED DESCRIPTION OF THE EMBODIMENTS

Exemplary embodiments of the present inventive concept will now be described more fully with reference to the accompanying drawings.

Figure 1:
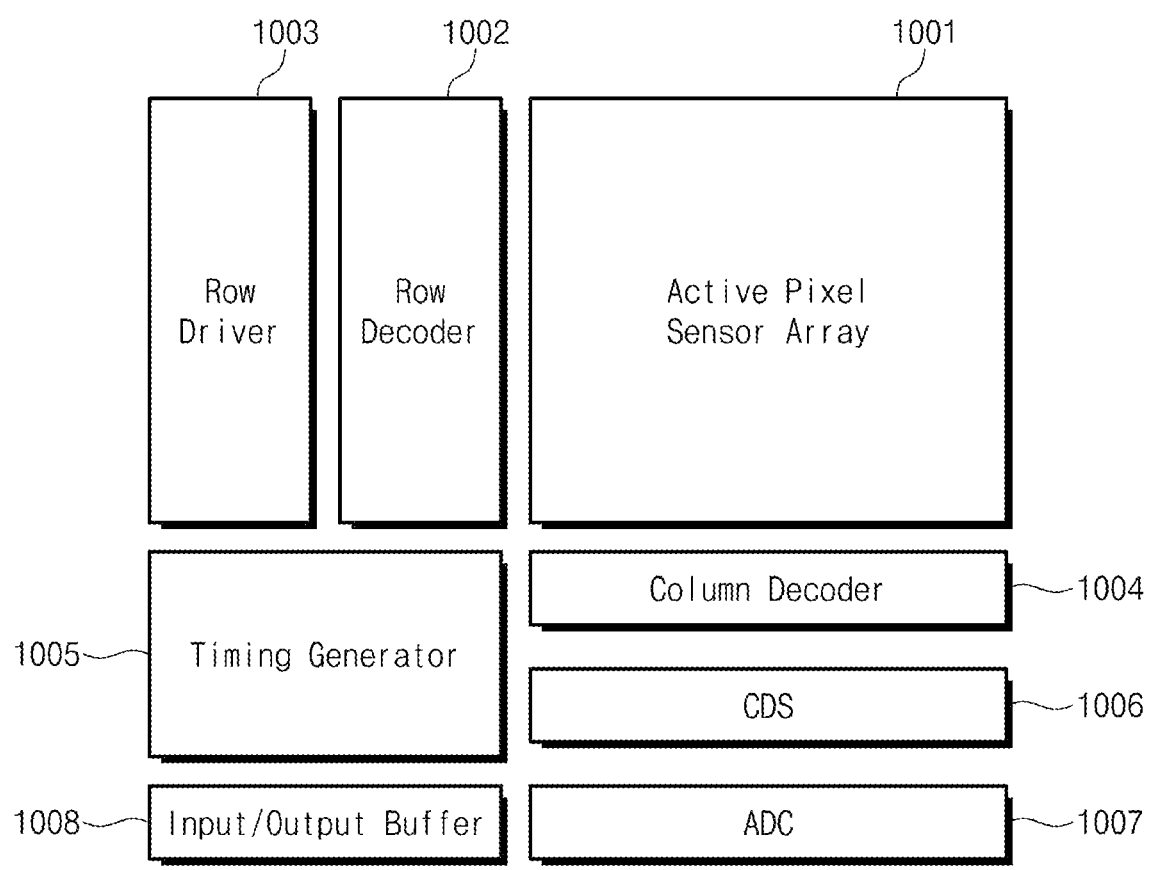
FIG. 1 illustrates a block diagram showing an image sensor according to an exemplary embodiment of the present inventive concept.

FIG. 1 illustrates a block diagram showing an image sensor according to an exemplary embodiment of the present inventive concept.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output buffer 1008.

The active pixel sensor array 1001 may include a plurality of two-dimensionally arranged unit pixels, each of which is configured to convert optical signals into electrical signals. The active pixel sensor array 1001 may be driven by a plurality of driving signals such as a pixel selection signal, a reset signal, and a charge transfer signal from the row driver 1003. The correlated double sampler 1006 may be provided with the converted electrical signals.

The row driver 1003 may provide the active pixel sensor array 1001 with several driving signals for driving several unit pixels in accordance with a decoded result obtained from the row decoder 1002, When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated from the active pixel sensor array 1001, and may hold and sample the received electrical signals. The correlated double sampler 1006 may perform a double sampling operation to sample a specific noise level and a signal level of the electrical signal, and then may output a level difference corresponding to a difference between the noise and signal levels.

The analog-to-digital converter 1007 may convert analog signals, which correspond to the difference level received from the correlated double sampler 1006, into digital signals, and then may output the converted digital signals.

The input/output buffer 1008 may latch the digital signals and then sequentially output the latched digital signals to an image signal processing unit in response to the decoded result obtained from the column decoder 1004.

Figure 2:
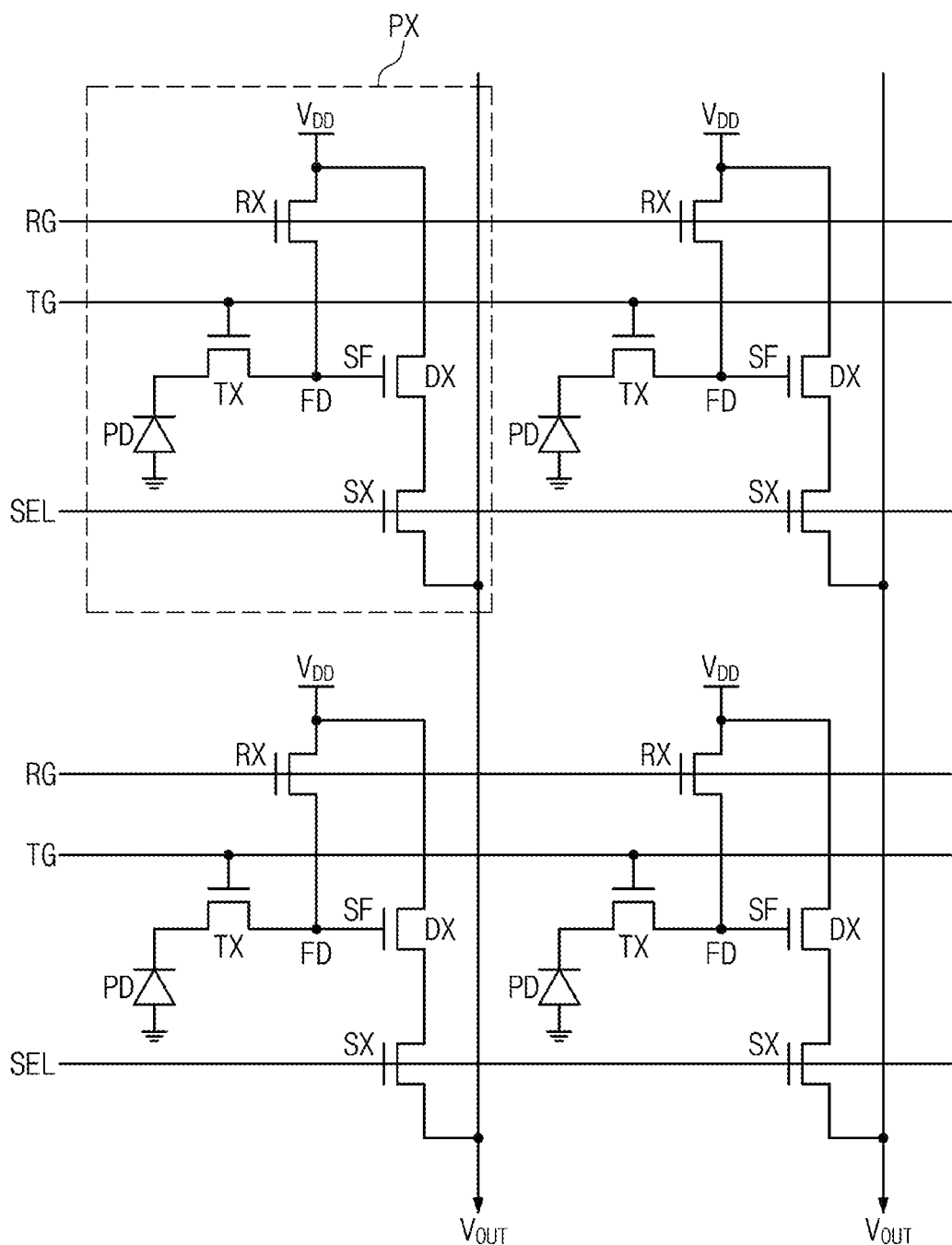
FIG. 2 illustrates a circuit diagram showing an active pixel sensor array of an image sensor according to an exemplary embodiment of the present inventive concept.

FIG. 2 illustrates a circuit diagram showing an active pixel sensor array of an image sensor according to an exemplary embodiment of the present inventive concept.

Referring to FIGS. 1 and 2, a sensor array 1001 may include a plurality of unit pixel regions PX, which may be arranged in a matrix shape. Each of the unit pixel regions PX may include a transfer transistor TX and logic transistors RX, SX, and DX. The logic transistors RX, SX, and DX may include a reset transistor RX, a selection transistor SX, and a source follower transistor DX. The transfer transistor TX may include a transfer gate TG. Each of the unit pixel regions PX may further include a photoelectric conversion element PD and a floating diffusion region FD.

The photoelectric conversion element PD may create and accumulate photo-charges in proportion to an amount of externally incident light. The photoelectric conversion element PD may include, for example, a photodiode, phototransistor, a photogate, a pinned photodiode, or a combination thereof. The transfer transistor TX may transfer charges generated in the photoelectric conversion element PD into the floating diffusion region FD. The floating diffusion region ED may accumulate and store charges that are generated and transferred from the photoelectric conversion element PD. The source follower transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ that is connected to the source electrode of the reset transistor RX. Accordingly, when the reset transistor RX is turned on, the charges accumulated in the floating diffusion region FD may be exhausted and thus the floating diffusion region FD may be reset.

The source follower transistor DX may serve as a source follower buffer amplifier. The source follower transistor DX may amplify a variation in electrical potential of the floating diffusion region FD and may output the amplified electrical potential to an output line $V_{OUT}$.

The selection transistor SX may select each row of the unit pixel regions PX to be readout. When the selection transistor SX is turned on, the power voltage $V_{DD}$ may be applied to a drain electrode of the source follower transistor DX.

Figure 3:
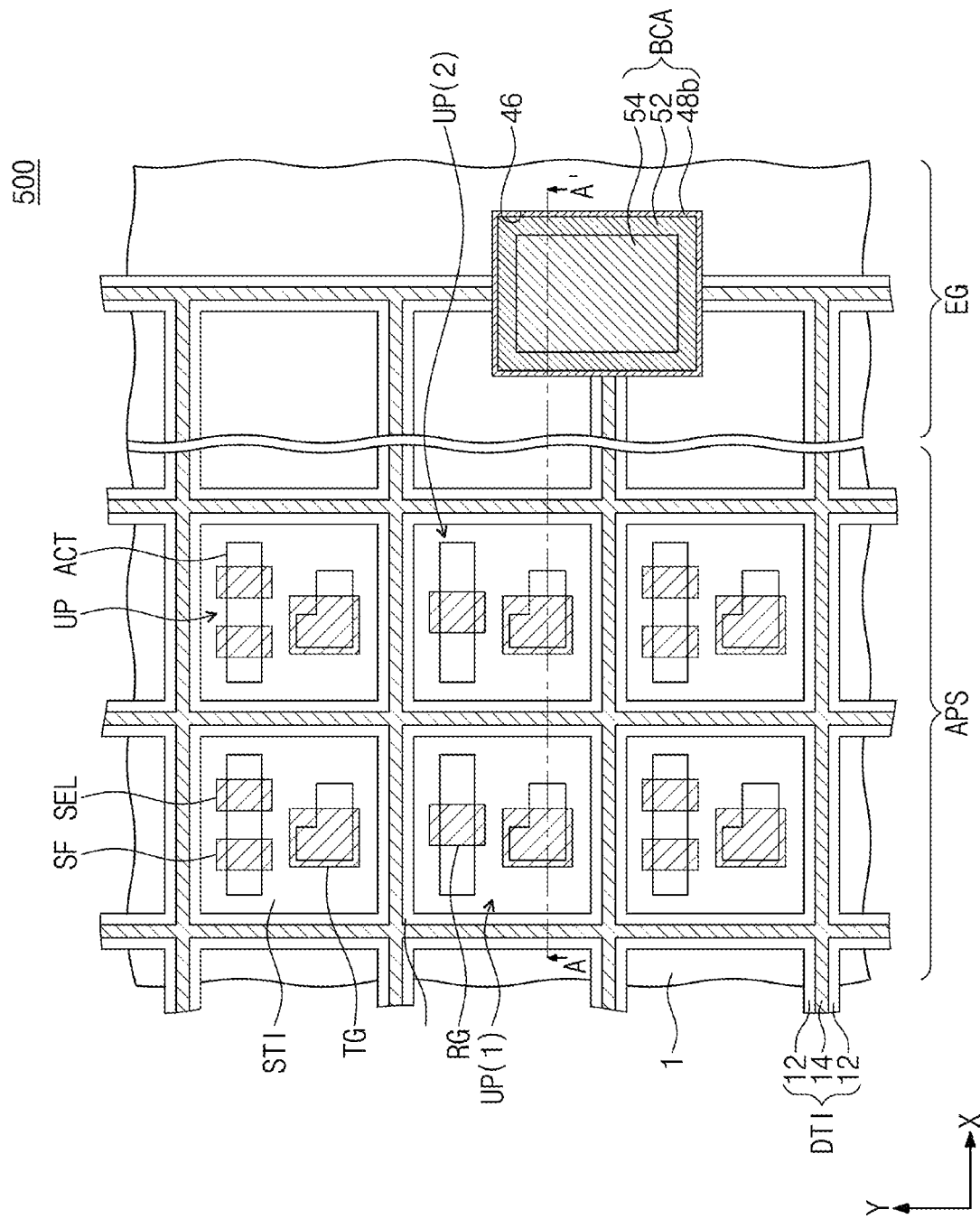
FIG. 3 illustrates a plan view showing an image sensor according to an exemplary embodiment of the present inventive concept.
Figure 4:
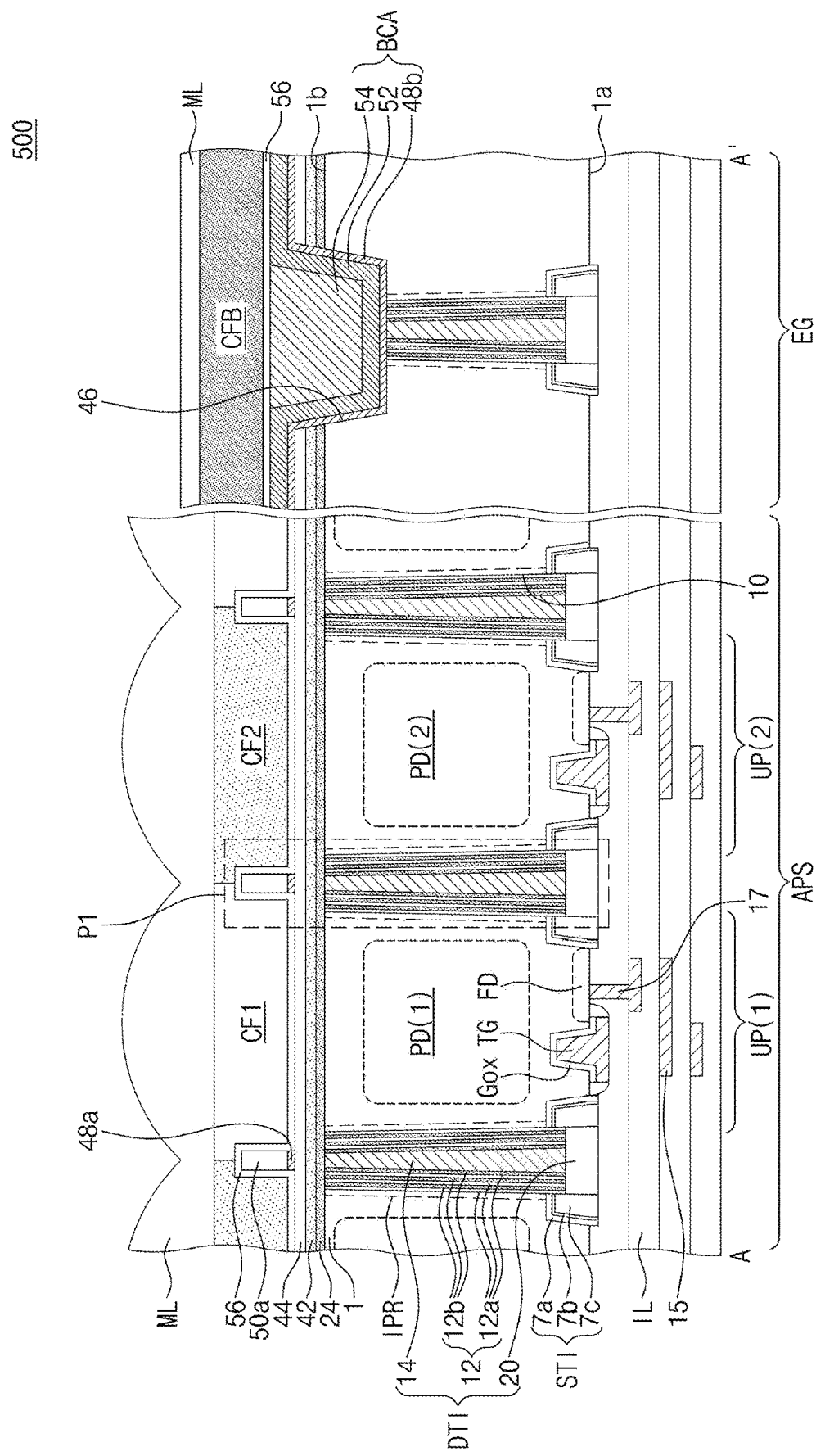
FIG. 4 illustrates a cross-sectional view taken along line A-A' of FIG. 3.

FIG. 3 illustrates a plan view showing an image sensor according to an exemplary embodiment of the present inventive concept. FIG. 4 illustrates a cross-sectional view taken along line A-A' of FIG. 3. FIGS. 5A to 5E illustrate enlarged view showing section P1 of FIG. 4.

Referring to FIGS. 3 and 4, an image sensor 500 according to an exemplary embodiment of the present inventive concept may include a first substrate 1. The first substrate 1 may be, for example, a single-crystalline silicon wafer, a silicon epitaxial layer, or a silicon-on-insulator (SOI) substrate. The first substrate 1 may be doped with, for example, impurities having a first conductivity type. For example, the first conductivity type may be a p-type. The first substrate 1 may have a first surface 1a and a second surface 1b that are opposite to each other. The first substrate 1 may include a pixel array area APS and an edge area EG. The pixel array area APS may include a plurality of unit pixels UP. The edge area EG may correspond to a portion of a connection area CNR of FIGS. 12 and 14.

The first substrate 1 may be provided with a pixel separation part DTI disposed therein and that separates and/or restricts the unit pixels UP on the pixel array area APS. The pixel separation part DTI may extend to the edge area. EG. The pixel separation part DTI may have a mesh shape when viewed in plan.

The first substrate 1 may be provided with photoelectric conversion elements PD disposed therein and on corresponding unit pixels UP. The photoelectric conversion elements PD may be doped with impurities having a second conductivity type opposite to the first conductivity type. The second conductivity type may be, for example, an n-type. The n-type impurities doped in the photoelectric conversion element PD and the p-type impurities doped in the first substrate 1 therearound may constitute a PN junction to provide a photodiode.

The first substrate 1 may be provided therein with a device isolation part STI adjacent to the first surface 1a. The pixel separation part DTI may penetrate the device isolation part STI. On each unit pixel UP, the device isolation part STI may limit active sections ACT adjacent to the first surface 1a. The active sections Act may be provided for the transistors TX, RX, DX, and SX of FIG. 2. The device isolation part STI may include a first device liner 7a, a second device liner 7b, and a device buried pattern 7c that are sequentially stacked on the first substrate 1. For example, at least a portion of the device isolation part STI may be covered by the first substrate 1. The second device liner 7b may include a different material from that of the first device liner 1a and that of the device buried pattern 7c. For example, the second device liner 7b may include silicon nitride, and each of the first device liner 7a and the device buried pattern 7c may include silicon oxide.

On each unit pixel UP, a transfer gate TG may be disposed on the first surface 1a of the first substrate 1. A portion of the transfer gate TG may extend into the first substrate 1. The transfer gate TG may be a vertical type. In addition, the transfer gate TG may be a planar type that does not extend into the first substrate 1. A gate dielectric layer Gox may be interposed between the transfer gate TG and the first substrate 1. A floating diffusion region FD may be disposed in the first substrate 1 on one side of the transfer gate TG. The floating diffusion region FD may be doped with impurities, for example, having the second conductivity type.

The image sensor 500 may be a backside illumination image sensor. The first substrate 1 may receive light incident through the second surface 1b of the first substrate 1. The PN junction may create electron-hole pairs from the incident light. The created electrons may migrate toward the photoelectric conversion element PD. When transfer gate TG is supplied with voltage, the electrons may migrate toward the floating diffusion region FD.

On one unit pixel UP, the first surface 1a may be provided thereon with a reset gate RG adjacent to the transfer gate TG. On another unit pixel UP, the first surface 1a may be provided thereon with a source follower gate SF and a selection gate SEL that are adjacent to the transfer gate TG. The gates TG, RG, SF, and SEL may correspond to gates of the transistors TX, RX, DX, and SX of FIG. 2. The gates TG, RG, SF, and SEL may overlap the active sections ACT.

The first surface 1a may be covered with first interlayer dielectric layers IL. The first interlayer dielectric layers IL may be formed of a multiple layer including at least one a silicon oxide layer, a silicon nitride layer, a silicon oxynitride layer, and/or a porous low-k dielectric layer. The first interlayer dielectric layers IL may be provided with first wiring lines 15 therebetween or therein. The floating diffusion region FD may be connected to a first contact plug 17 that is connected to the first wiring lines 15. On the pixel array area APS, the first contact plug 17 may penetrate a lowermost one of the first interlayer dielectric layers IL that is most adjacent to the first surface 1a.

Figure 5A:
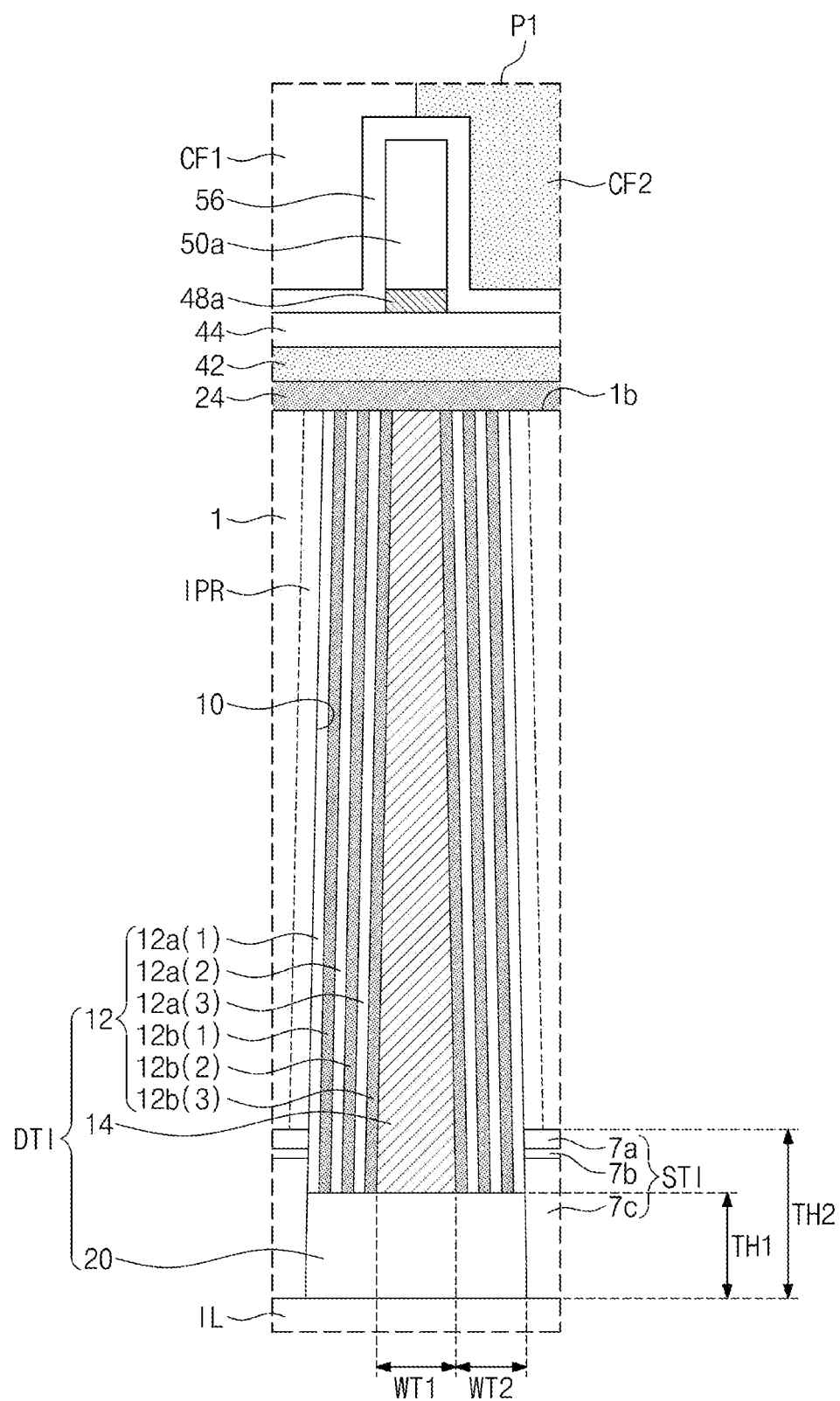
FIGS. 5A, 5B, 5C, 5D, and 5E illustrate enlarged views showing section P1 of FIG. 4.

Referring to FIGS. 4 and 5A, the pixel separation part DTI may be disposed in a front-side deep trench 10 that is formed to extend from the first surface 1a toward the second surface 1b in the first substrate 1. The front-side deep trench 10 may have a width that decreases in a direction from the first surface 1a toward the second surface 1b. The pixel separation part DTI may include a conductive structure 14, a front-side buried pattern 20, and a reflective structure 12. The reflective structure 12 may be disposed on and may cover a sidewall of the conductive structure 14. For example, the reflective structure 12 may completely cover a sidewall of the conductive structure 14. The reflective structure 12 may be interposed between the conductive structure 14 and the first substrate 1. The front-side buried pattern 20 may be in contact with a bottom surface of the conductive structure 14 and a bottom surface of the reflective structure 12.

An impurity region IPR may be disposed on a sidewall of the front-side deep trench 10. The impurity region IPR may be doped with impurities having the first conductivity type the same as that of impurities doped into the first substrate 1, and an impurity concentration of the impurity region IPR may be greater than that of the first substrate 1. For example, the first conductivity type may be a p-type, and the impurities may be boron. The impurity region IPR may prevent the photoelectric conversion element PD from receiving electrons trapped by dangling bonds possibly present on the sidewall of the front-side deep trench 10, which may result in an improvement in dark current or white spot.

As illustrated in FIG. 5A, the front-side buried pattern 20 may have a first thickness TH1. The device isolation part STI may have a second thickness TH2 greater than the first thickness TH1. The device isolation part STI may be disposed on a sidewall of the front-side buried pattern 20 and a sidewall of the reflective structure 12. For example, the device isolation part STI may be in contact with a sidewall of the front-side buried pattern 20 and a sidewall of the reflective structure 12.

Figure 5B:
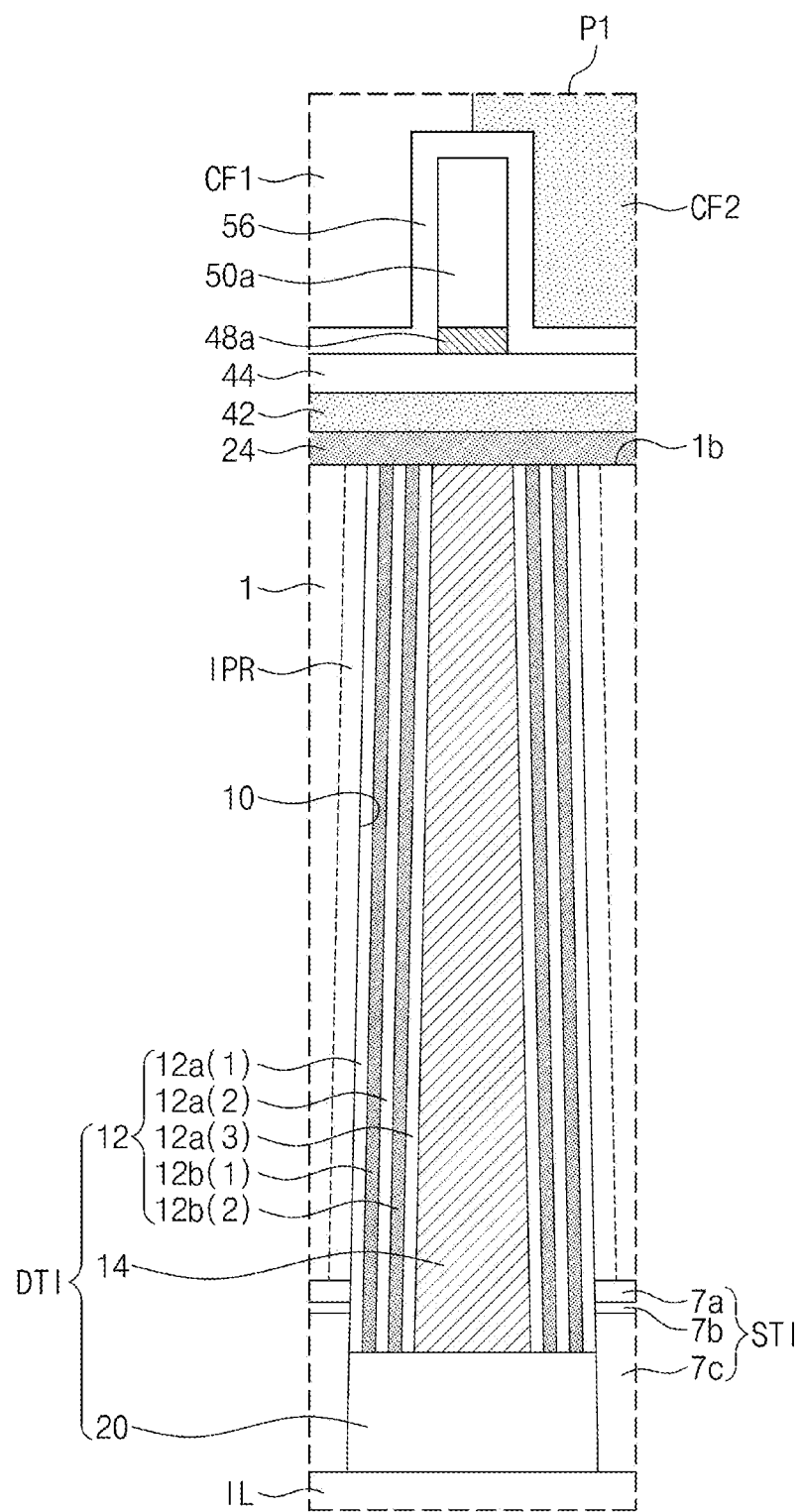
Figure 5C:
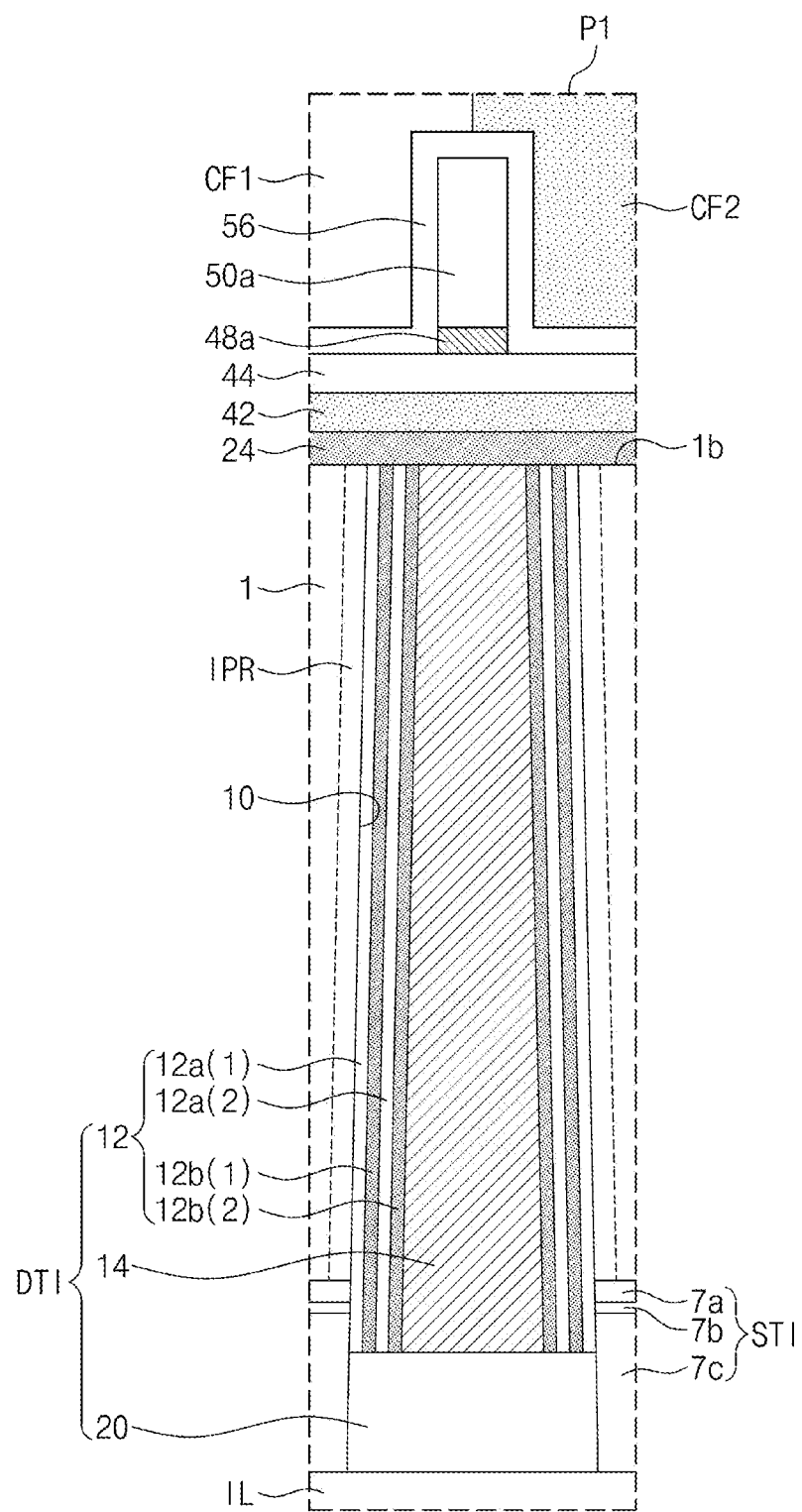
Figure 5D:
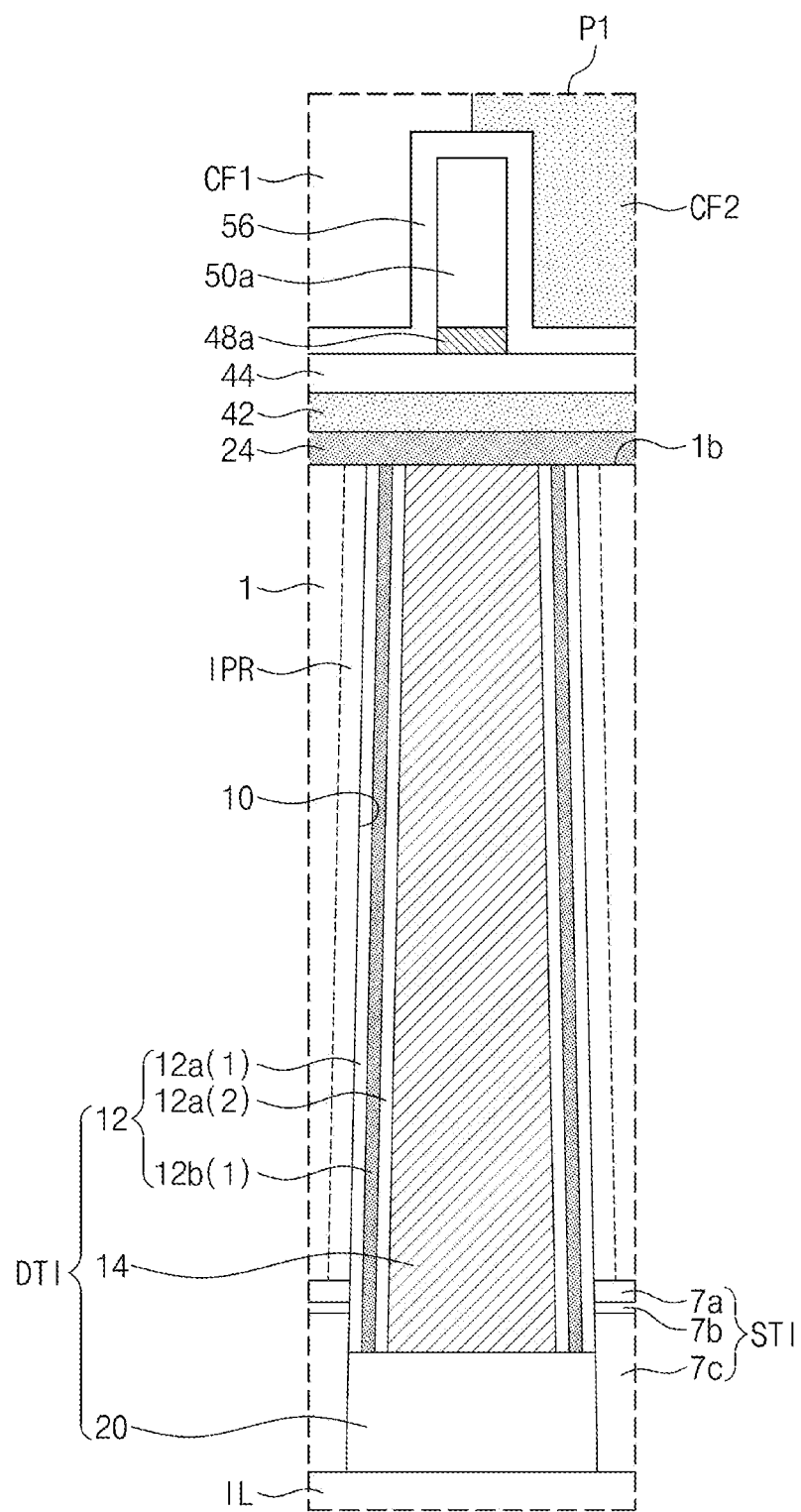
Figure 5E:
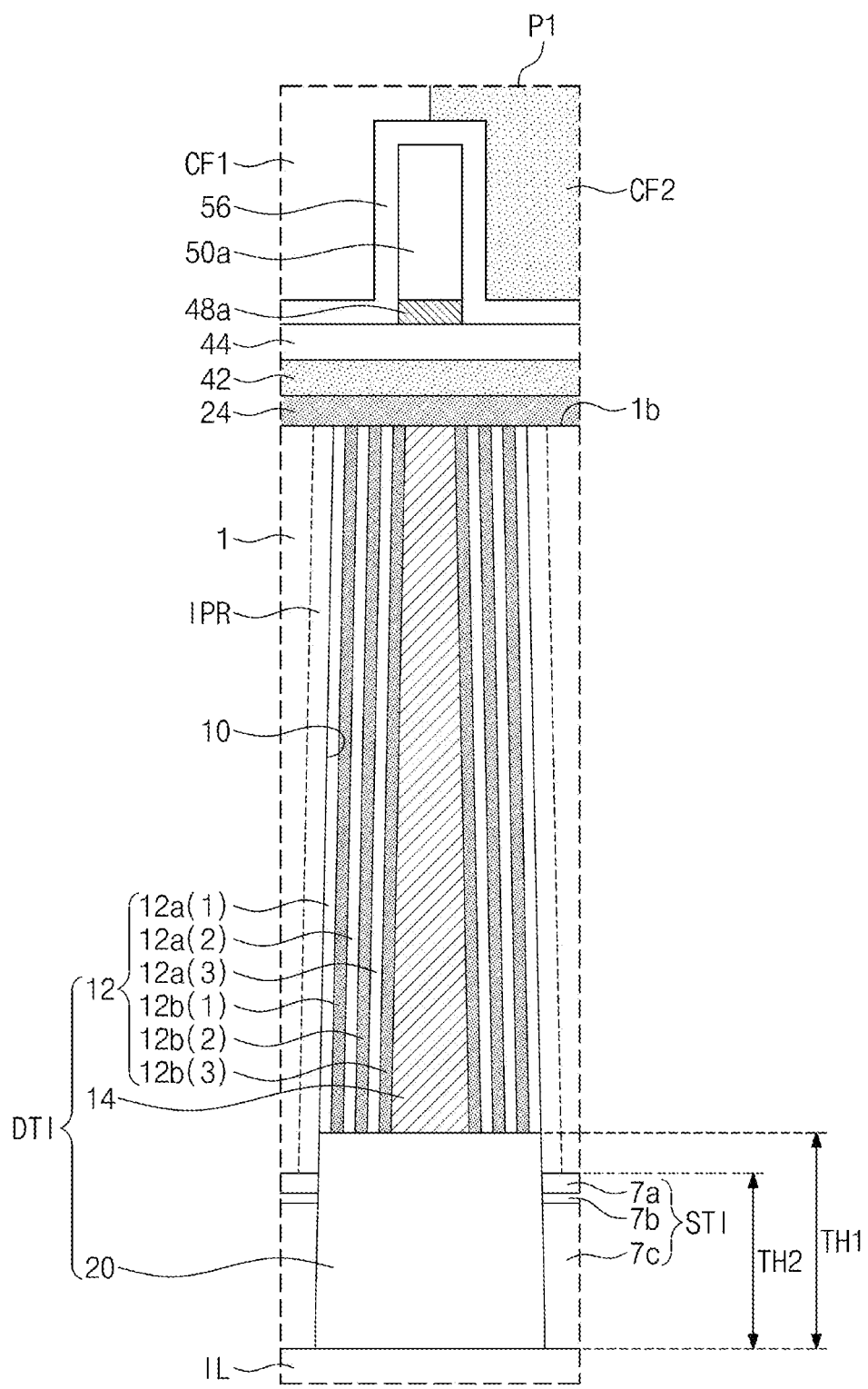

In addition, as illustrated in FIG. 5E, the device isolation part STI may have a second thickness TH2 less than the first thickness TH1. For example, the device isolation part STI may be in contact with the front-side buried pattern 20 and spaced apart from the reflective structure 12.

When viewed in plan, the pixel separation part DTI and the conductive structure 14 may have a mesh shape. When viewed in plan, the conductive structure 14 may separate a plurality of reflective structures 12 from each other, and each of the reflective structures 12 may have an annular shape that surrounds a neighboring unit pixel UP adjacent thereto or the photoelectric conversion element PD inside the unit pixel UP. For example, one of the reflective structures 12 may surround a first unit pixel UP(1) or a first photoelectric conversion element PD(1) inside the first unit pixel UP(1). Another of the reflective structures 12 may surround a second unit pixel UP(2) or a second photoelectric conversion element PD(2) inside the second unit pixel UP(2).

The conductive structure 14 may include polysilicon doped with impurities. The impurities may be one of for example, boron, phosphorus, and arsenic. For example, the impurities may be boron. A negative bias voltage may be applied to the conductive structure 14. Therefore, the conductive structure 14 may serve as a common bias line. Thus, dark current characteristics may be improved due to holding of holes (or positive charges) possibly present on a surface of the first substrate 1 in contact with the pixel separation part DTI. The conductive structure 14 may have a width WT1 of about 100 Å to about 300 Å. When the conductive structure 14 has a width less than about 100 Å, the conductive structure 14 may be insufficient to serve as a common bias line, and when the conductive structure 14 has a width greater than about 300 Å, the conductive structure 14 may reduce in modulation transfer function (MTF) properties.

The reflective structure 12 may include first reflective liners 12a and second reflective liners 12b that are alternately disposed in a direction toward the conductive structure 14 from a lateral surface of the first substrate 1. The first reflective liners 12a may have a refractive index different from that of the second reflective liners 12b. The number of the first reflective liners 12a and of the second reflective liners 12b may be two to ten.

In FIGS. 4 and 5A the number of the first reflective liners 12a may be three, and the number of the second reflective liners 12b may be three. For example, three first reflective liners 12a(1), 12a(2), and 12a(3) and three second reflective liners 12b(1), 12b(2), and 12b(3) may be alternately disposed in a direction toward the conductive structure 14 from the lateral surface of the first substrate 1. The lateral surface of the first substrate 1 may overlap an outermost one (e.g., 12a(1)) of the first reflective liners 12a(1), 12a(2), and 12a(3), and innermost one (e.g., 12b(3)) of the second reflective liners 12b(1), 12b(2), and 12b(3) may overlap the conductive structure 14. For example, the first substrate 1 may be in contact with an outermost one (e.g., 12a(1)) of the first reflective liners 12a(1), 12a(2), and 12a(3), and the conductive structure 14 may be in contact with an innermost one (e.g., 12b(3)) of the second reflective liners 12b(1), 12b(2), and 12b(3).

In addition, as illustrated in FIG. 5B, the number of the first reflective liners 12a may be three, and the number of the second reflective liners 12b may be two. For example, three first reflective liners 12a(1), 12a(2), and 12a(3) and two second reflective liners 12b(1) and 12b(2) may be alternately disposed in a direction toward the conductive structure 14 from the lateral surface of the first substrate 1. The first substrate 1 may be in contact with an outermost one (e.g., 12a(1)) of the first reflective liners 12a(1), 12a(2), and 12a(3), and the conductive structure 14 may be in contact with an innermost one (e.g., 12a(3)) of the first reflective liners 12a(1), 12a(2), and 12a(3).

In addition, as illustrated in FIG. 5C, the number of the first reflective liners 12a may be two, and the number of the second reflective liners 12b may be two. For example, two first reflective liners 12a(1) and 12a(2) and two second reflective liners 12b(1) and 12b(2) may be alternately disposed in a direction toward the conductive structure 14 from the lateral surface of the first substrate 1. The first substrate 1 may be in contact with an outermost one (e.g., 12a(1)) of the first reflective liners 12a(1) and 12a(2), and the conductive structure 14 may be in contact with an innermost one (e.g., 12b(2)) of the second reflective liners 12b(1) and 12b(2).

In addition, as illustrated in FIG. 5D, the number of the first reflective liners 12a may be two, and the number of the second reflective liner 12b may be one. For example, two first reflective liners 12a(1) and 12a(2) and one second reflective liner 12b may be alternately disposed in a direction toward the conductive structure 14 from the lateral surface of the first substrate 1. The first substrate 1 may be in contact with an outermost one (e.g., 12a(1)) of the first reflective liners 12a(1) and 12a(2), and the conductive structure 14 may be in contact with an innermost one (e.g., 12a(2)) of the first reflective liners 12a(1) and 12a(2).

There may be an increase in total reflection efficiency of the reflective structure 12 having a structure discussed above. Therefore, when light is directed toward the pixel separation part DTI after obliquely entering into a certain unit pixel, the light may all be reflected from the reflective structure 12 and then may be guided back into the certain unit pixel. It may thus be possible to prevent undesirable incidence of light from the certain unit pixel toward an adjacent unit pixel. Accordingly, crosstalk may be prohibited between unit pixels and light efficiency may be increased.

The second reflective liners 12b may have a dielectric constant greater than that of the first reflective liners 12a. The reflective structure 12 may include the second reflective liners 12b whose dielectric constant is relatively high. Therefore, a negative bias voltage applied to the conductive structure 14 may affect a sidewall of the pixel separation part DTI. In this case, holes may be fairly trapped at the sidewall of the pixel separation part DTI, and thus dark current due to the holes may be prevented. As a result, a sharp image quality may be accomplished.

For example, the first reflective liners 12a may each include silicon oxide, and the second reflective liners 12b may each include SiN, SiCN, SiOCN, or SiON.

The reflective structure 12 may have a width WT2 (or thickness) of about 100 Å to about 250 Å, and thus it may be possible to minimize or prevent degradation of dark current characteristics and modulation transfer function (MTF) properties and also to increase light sensitivity.

The second surface 1b may be in contact with a first fixed charge layer 24. The first fixed charge layer 24 may be formed of a single or multiple layer including either a metal oxide layer including oxygen whose amount is less than its stoichiometric ratio or a metal fluoride layer including fluorine whose amount is less than its stoichiometric ratio. The first fixed charge layer 24 may thus have a negative fixed charge. The first fixed charge layer 24 may be formed of a single or multiple layer including one of metal oxide and metal fluoride that include at least one of, for example, hafnium (Hf), zirconium (Zr), aluminum (Al), tantalum (Ta), titanium (Ti), yttrium (Y), and/or lanthanides. For example, the first fixed charge layer 24 may include one or more of a hafnium oxide layer and/or an aluminum oxide layer. The first fixed charge layer 24 may suppress or reduce dark current and white spot.

A second fixed charge layer 42 and a first protection layer 44 may be sequentially stacked on the first fixed charge layer 24. The second fixed charge layer 42 may include a single or multiple layer of one of a metal oxide layer and a metal fluoride layer. The second fixed charge layer 12 may include, for example, one or more of a hafnium oxide layer and/or an aluminum oxide layer. The second fixed charge layer 42 may serve as an adhesive or reinforcement layer for the first fixed charge layer 24. The first protection layer 44 may include at least one of plasma enhanced tetraethylorthosilicate (PE-TEOS), SiOC, SiO$_2$, SiN, hafnium oxide, and aluminum oxide. The first protection layer 44 may serve as one or more of an antireflective layer and/or a planarized layer.

Referring to FIGS. 3 and 4, on the edge area EG, a connection contact BCA may contact the conductive structure 14 and may penetrate the first protection layer 44, the second fixed charge layer 42, the first fixed charge layer 24, and a portion of the first substrate 1. The connection contact BCA may be positioned within a first trench 46. The connection contact BCA may include a diffusion stop pattern 48b, a first metal pattern 52, and a second metal pattern 54. The diffusion stop pattern 48b may conformally cover an inner sidewall and a bottom surface of the first trench 46. The first metal pattern 52 may be disposed on the diffusion stop pattern 48b. The second metal pattern 54 may fill the first trench 46 and may be disposed on the first metal pattern 54. The diffusion stop pattern 48b may include, for example, titanium. The first metal pattern 52 may include, for example, tungsten. The second metal pattern 54 may be or include, for example, aluminum. The diffusion stop pattern 48b and the first metal pattern 52 may extend onto the first protection layer 44 to electrically connect to other wiring lines, vias, or contacts.

On the pixel array area APS, a light-shield pattern 48a and a low-refractive pattern 50a may be sequentially stacked on the first protection layer 44. On the pixel array area APS, the light-shield pattern 48a and the low-refractive pattern 50a may have a mesh shape when viewed in plan, and may overlap the pixel separation part DTI. The light-shield pattern 48a may have the same material and thickness as those of the diffusion stop pattern 48b; however, the present inventive concept is not limited thereto. The light-shield pattern 48a may include, for example, titanium. The low-refractive pattern 50a may include an organic material. The low-refractive pattern 50a may have a refractive index less than those of color filters CF1 and CF2 which will be discussed below. For example, the low-refractive pattern 50a may have a refractive index of equal to or less than about 1.3. The low-refractive pattern 50a may have a sidewall substantially aligned with that of the light-shield pattern 48a. The light-shield pattern 48a and the low-refractive pattern 50a may prevent crosstalk between neighboring pixels.

A second protection layer 56 may be stacked on the first protection layer 44. The second protection layer 56 may conformally cover the low-refractive pattern 50a, the light-shield pattern 48a, and the connection contact BCA. On the pixel array area APS, color filters CF1 and CF2 may be arrayed between the low-refractive patterns 50a. Each of the color filters CF1 and CF2 may have one of blue, green, and red colors. The color filters CF1 and CF2 may be arranged in one of Bayer pattern, 2×2 Tetra pattern, and 3×3 Nona pattern. In addition, the color filters CF1 and CF2 may include other colors such as cyan, magenta, or yellow.

On the edge area. EG, a first optical black pattern CFB may be disposed on the second protection layer 56. The first optical black pattern CFB may include, for example, a material the same as that of a blue color filter. A microlens array layer ML may be disposed on the color filters CF1 and CF2. The microlens array layer ML may include convex lenses that overlap corresponding unit pixels UP. A portion of the microlens array layer ML may extend onto the first optical black pattern CFB.

FIGS. 6A, 6B, 6C, 6D, 6E, 6F, 6G, 6H and 6I illustrate cross-sectional views showing a method of fabricating the image sensor depicted in FIG. 4.

Figure 6A:
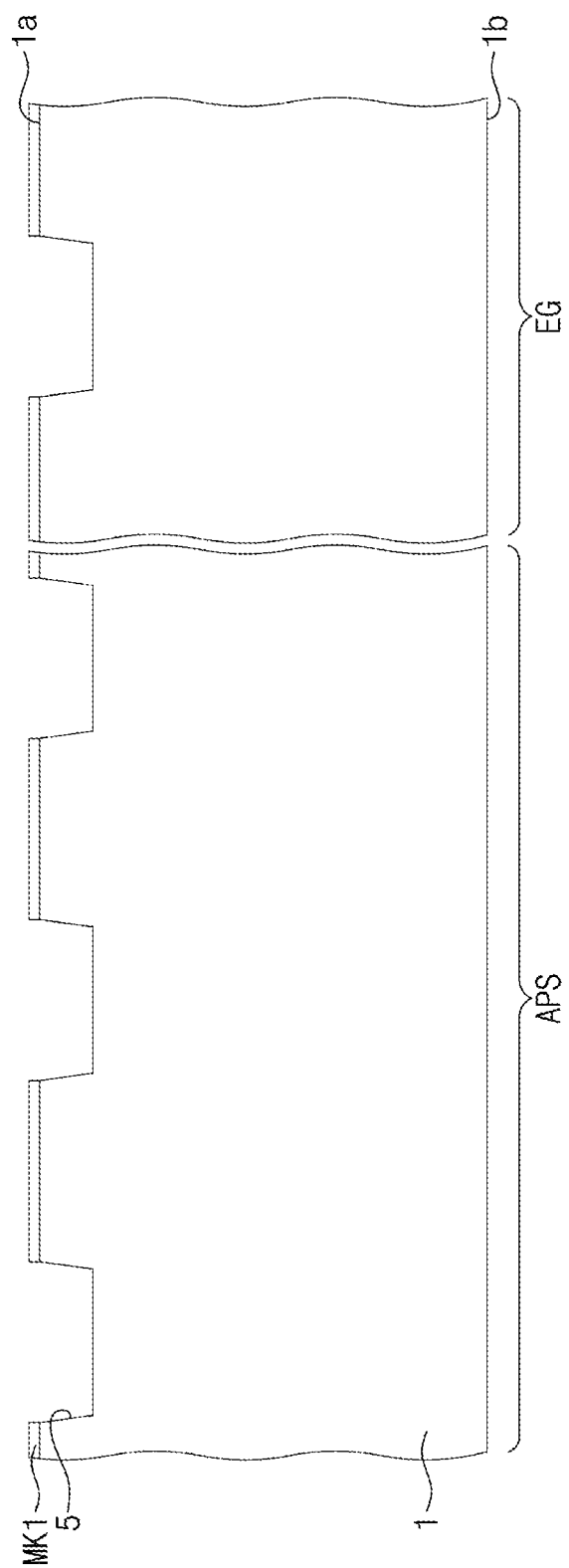
FIGS. 6A, 6B, 6C, 6D, 6E, 6F, 6G, 6H and 6I illustrate cross-sectional views showing a method of fabricating the image sensor depicted in FIG. 4.

Referring to FIG. 6A, a first substrate 1 may be prepared which includes a pixel array area APS and an edge area EG. The first substrate 1 may have a first surface 1a and a second surface 1b that are opposite to each other. The first substrate 1 may be, for example, a single-crystalline silicon wafer or a silicon epitaxial layer. A first mask layer may be stacked on the first surface 1a of the first substrate 1, and then the first mask layer may be patterned to form a first mask pattern MK1. The first mask pattern MK1 may have openings that define a position of a shallow device isolation part. The first mask pattern. MK1 may include, for example, a silicon nitride layer. The first mask pattern MK1 may be used as an etching mask such that the first substrate 1 may be etched to form a shallow trench 5.

Figure 6B:
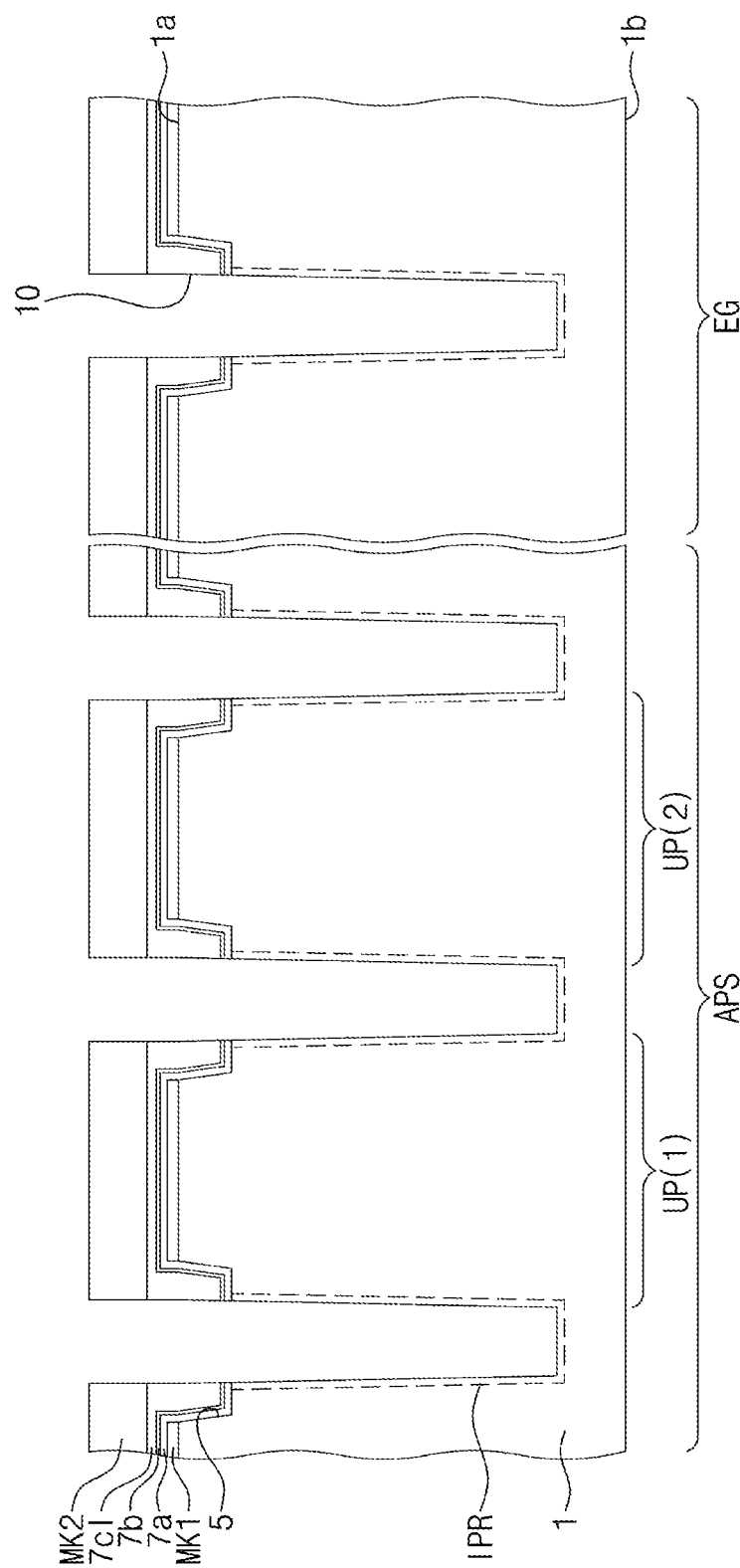

Referring to FIG. 6B, a first device liner 7a and a second device liner 7b may be sequentially formed on the first surface 1a of the first substrate 1, thereby covering the shallow trench 5. A device buried layer 7cl may be stacked to fill the shallow trench 5. A second mask pattern MK2 may be formed on the device buried layer 7cl. The second mask pattern MK2 may limit a position of a front-side deep trench 10. The second mask pattern MK2 may be used as an etching mask to etch the device buried layer 7cl, the second device liner 7b, the first device liner 7a, and the first substrate 1, thereby forming the front-side deep trench 10. An ion implantation process or a plasma assisted doping (PLAD) process may be performed to dope first impurities through the front-side deep trench 10, with the result that an impurity region IPR may be formed. The first impurities may be, for example, boron.

Figure 6C:
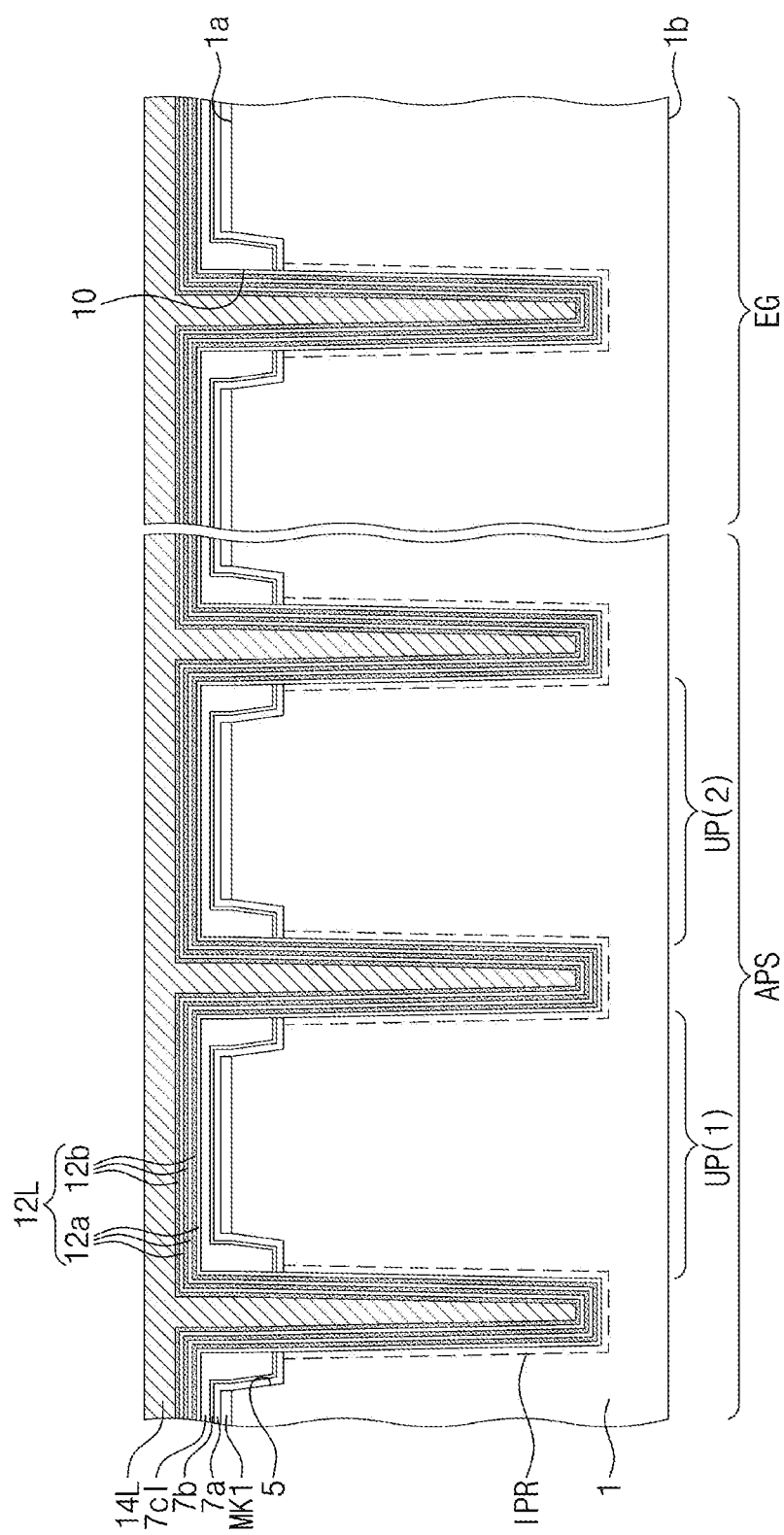

Referring to FIGS. 6B and 6C, the second mask pattern MK2 may be removed to expose a top surface of the device buried layer 7cl. A reflective structure layer 12L may be formed on the device buried layer 7cl. The formation of the reflective structure layer 12L may include alternately and repeatedly stacking first reflective liners 12a and second reflective liners 12b. The first reflective liners 12a and the second reflective liners 12b may be conformally formed. The first reflective liners 12a may be formed of, for example, a silicon oxide layer. The first reflective liners 12a, may be formed by, for example, atomic layer deposition (ALD) performed at about 200° C. to about 500° C. The second reflective liners 12b may be formed of, for example, SiN, SiCN, SiOCN, or SiON. The second reflective liners 12b may be formed either by, for example, atomic layer deposition (ALD) performed at a temperature of about 450° C. to about 700° C. or by low-pressure chemical vapor deposition (LPCVD) performed at a temperature of about 630° C. to about 810° C. A conductive structure layer 14L may be formed on the reflective structure layer 12L to fill the front-side deep trench 10. The conductive structure layer 14L may be formed by, for example, depositing polysilicon while in-situ doping impurities.

Figure 6D:
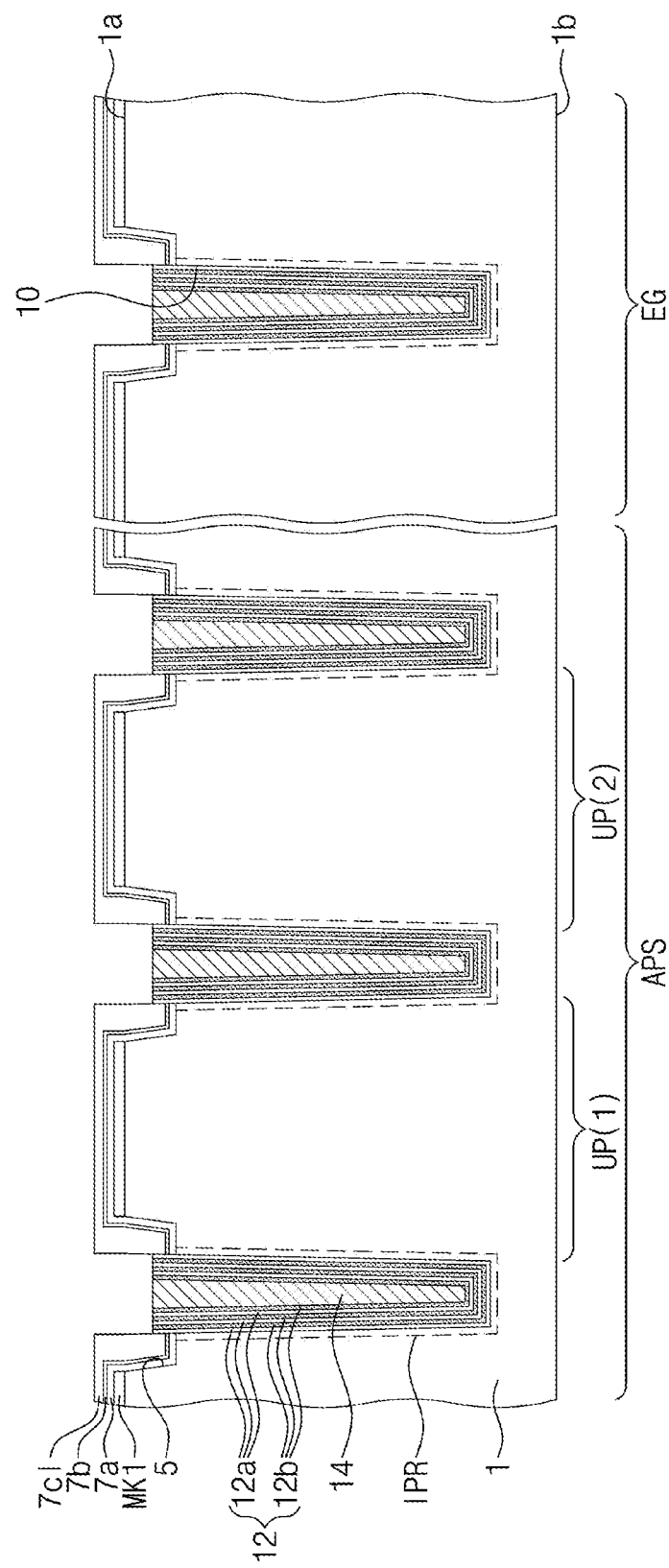

Referring to FIGS. 6C and 6D, the conductive structure layer 14L and the reflective structure layer 12L may undergo an etch-hack process to expose a lateral surface of the device buried layer 7cl while forming a reflective structure 12 and a conductive structure 14 in the front-side deep trench 10.

Figure 6E:
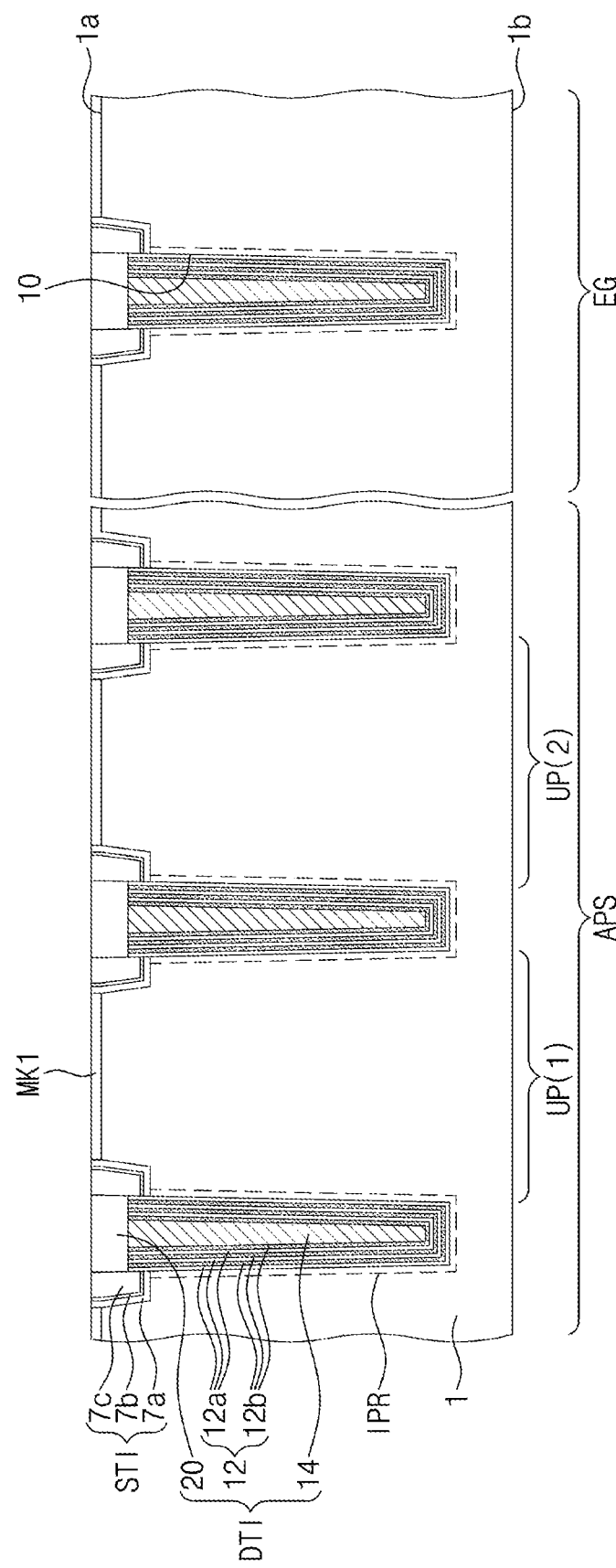

Referring to FIG. 6E, a front-side buried layer may be stacked to fill an upper portion of the front-side deep trench 10, and then annealing process may be performed. The annealing process may activate impurities included in the conductive structure 14 and may allow polysilicon in the conductive structure 14 to convert an amorphous state into a crystalline state. A chemical mechanical polishing (CMP) process may be performed to expose a top surface of the first mask pattern MK1. The first mask pattern MK1 may serve as a CMP stop layer. In this step, a portion of the first device liner 7a, a portion of the second device liner 7b, and a portion of the device buried layer 7cl that are disposed on the first mask pattern MK1 may be removed to form a device isolation part STI. In addition, a pixel separation part DTI may be formed.

Figure 6F:
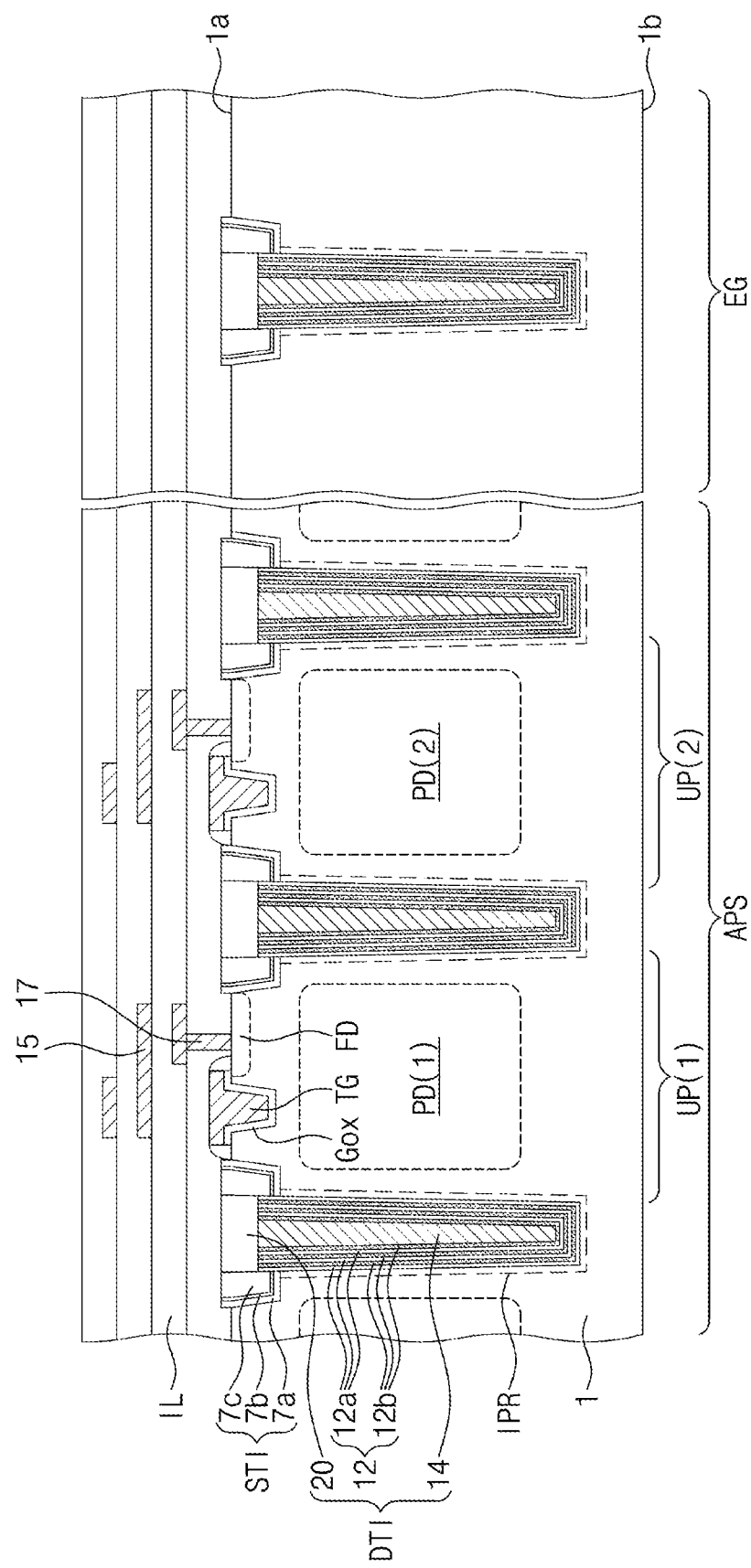

Referring to FIGS. 6E and 6F, the first mask pattern MK1 may be removed to expose the first surface 1a of the first substrate 1. The first substrate 1 may undergo an ion implantation process to form a photoelectric conversion element PD. A typical process may be performed to form a gate dielectric layer Gox, a transfer gate TG, a floating diffusion region FD, a first contact plug 17, first wiring lines 15, and first interlayer dielectric layers IL on the first surface 1a of the first substrate 1.

Figure 6G:
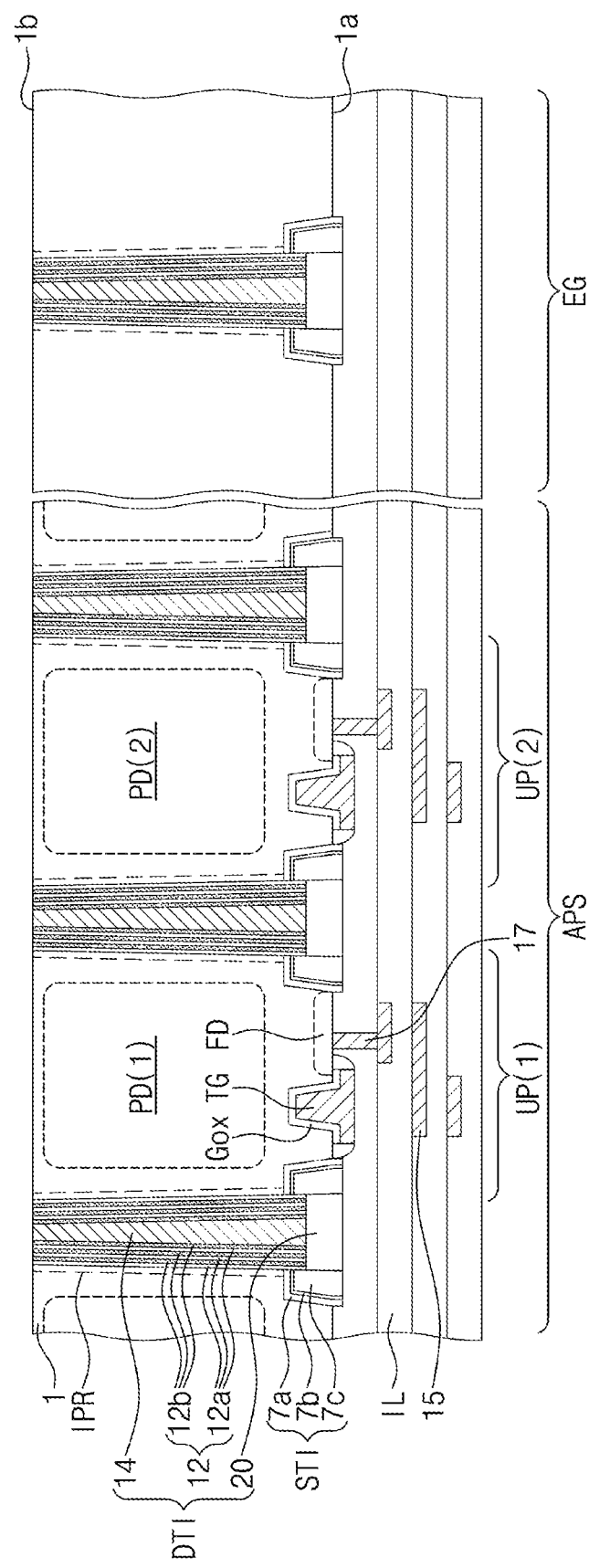

Referring to FIG. 6G, a back grinding process may be performed to partially remove the first substrate 1 and the pixel separation part DTI that are adjacent to the second surface 1b. In this step, the reflective structure 12 of the pixel separation part DTI may be partially removed to expose the conductive structure 14.

Figure 6H:
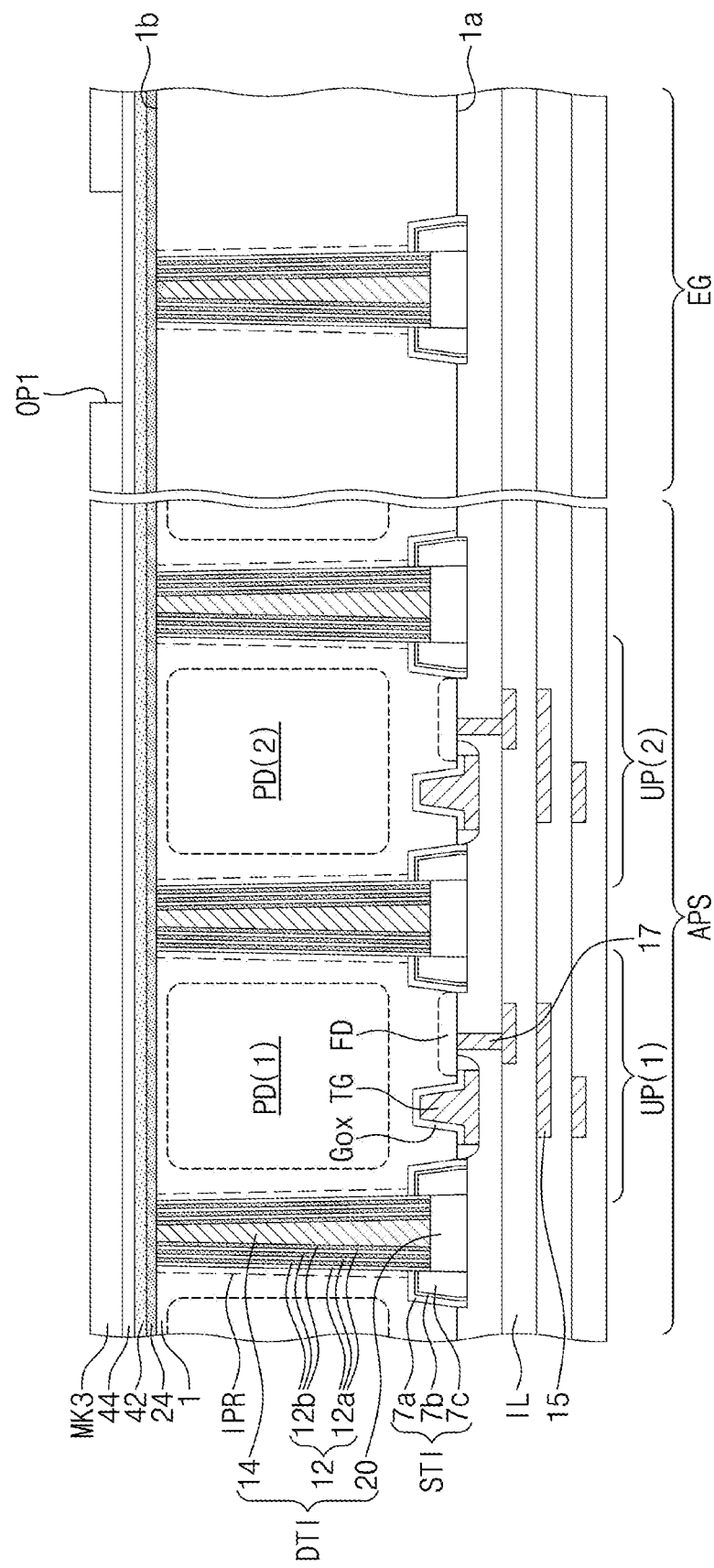

Referring to FIG. 6H, a first fixed charge layer 24 may be stacked on the second surface 1b. A second fixed charge layer 42 and a first protection layer 44 may be sequentially stacked on the first fixed charge layer 24. A third mask pattern MK3 may be formed on the first protection layer 44. The third mask pattern MK3 may have a first opening OP1 that exposes a portion of the edge area EQ.

Figure 6I:
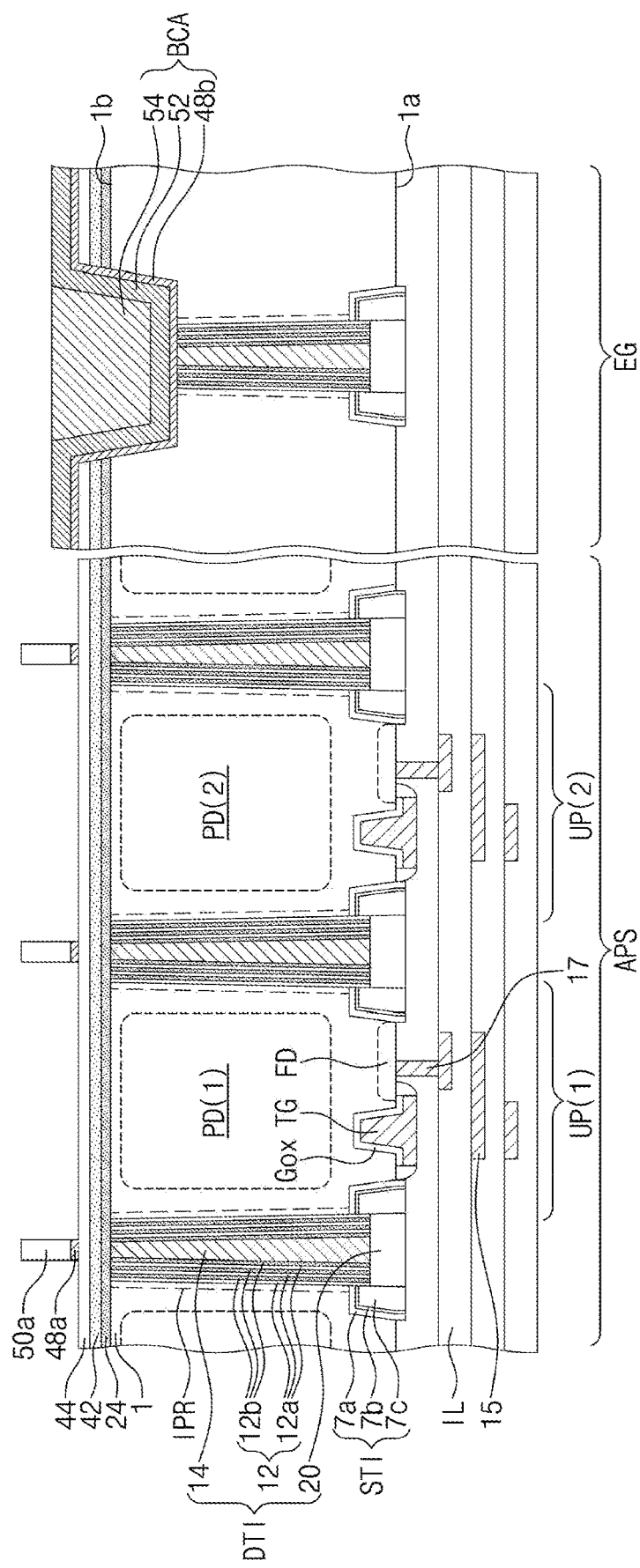

Referring to FIGS. 6H and 6I, on the edge area EG, the third mask pattern MK3 may be used as an etching mask to etch the first protection layer 44, the second fixed charge layer 42, the first fixed charge layer 24, the first substrate 1, and a portion of the pixel separation part DTI, thereby forming a first trench 46 that exposes the conductive structure 14 of the pixel separation part DTI on the edge area EG. The third mask pattern MK3 may be removed. A diffusion stop layer and a first metal layer may be sequentially stacked on the first protection layer 44. The first metal layer may be etched to form a first metal pattern 52 on the edge area EG. On the pixel array area APS, a low-refractive pattern 50a may be formed on the diffusion stop layer. The diffusion stop layer may be etched to form a light-shield pattern 48a on the pixel array area APS and also to form a diffusion stop pattern 48b on the edge area EG. A second metal pattern 54 may be formed to fill the first trench 46. The second metal pattern 54, the first metal pattern 52, and the diffusion stop pattern 48b may constitute a connection contact BCA.

Subsequently, referring to FIG. 4, a second protection layer 56 may be conformally formed on the first protection layer 44 and the connection contact BCA. Color filters CF1 and CF2 may be formed on the second protection layer 56 and between the low-refractive patterns 50a. In this step, a first optical black pattern CFB may be formed on the edge area EG. A microlens array layer ML may be formed on the color filters CF1 and CF2 and the first optical black pattern CFB. Accordingly, an image sensor 500 may be fabricated as shown in FIG. 4.

In a method of fabricating an image sensor according to an exemplary embodiment of the present inventive concept, a pixel separation part may be formed to improve modulation transfer function (MTF), dark current, and crosstalk, and an image sensor having the pixel separation part may be stably formed at high yields without process failure.

Figure 7:
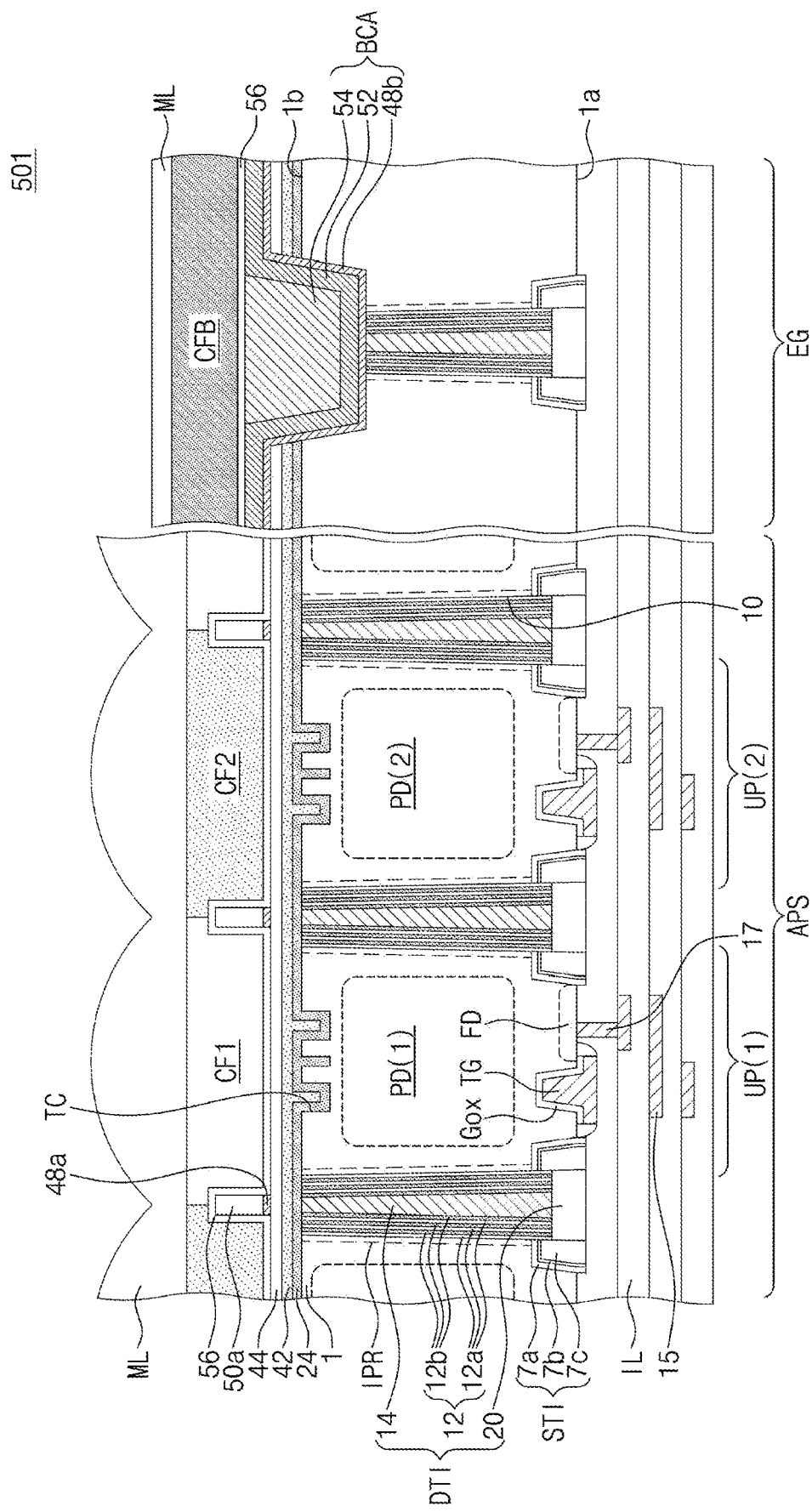
FIG. 7 illustrates a cross-sectional view taken along line A-A' of FIG. 3.

FIG. 7 illustrates a cross-sectional view taken along line A-A' of FIG. 3.

Referring to FIG. 7, an image sensor 501 according to the present embodiment may include at least one substrate trench TC formed on the second surface 1b of the first substrate 1. The substrate trench TC may have a polygonal shape (e.g., a triangular shape, a tetragonal shape, or a pentagonal shape), a cross shape, a star shape, or any other suitable shape. The substrate trench TC may be formed on a location at which the microlens array layer ML allows incident light to concentrate. For example, the substrate trench TC may overlap the microlens array layer ML. The first fixed charge layer 24 may be partially inserted into the substrate trench TC to conformally cover an inner sidewall and a bottom surface of the substrate trench TC. When the substrate trench TC has a relatively small width, the substrate trench TC may be filled with the first fixed charge layer 24. A portion of the second fixed charge layer 42 may also be inserted into the substrate trench TC.

The substrate trench TC may serve as an optical splitter that scatters light that is incident from the second surface 1b. Therefore, incident light may be scattered and reflected multiple times in the first substrate 1, and an optical path may become longer. For this reason, the quantum efficiency may increase. Accordingly, it may be possible to increase sensitivity of light, such as infrared light or red wavelength light, for which sensitivity may typically be low due to its relatively long wavelength. The image sensor 501 may be called an infrared sensor. Other structural features nay be identical or similar to those discussed above.

Figure 8:
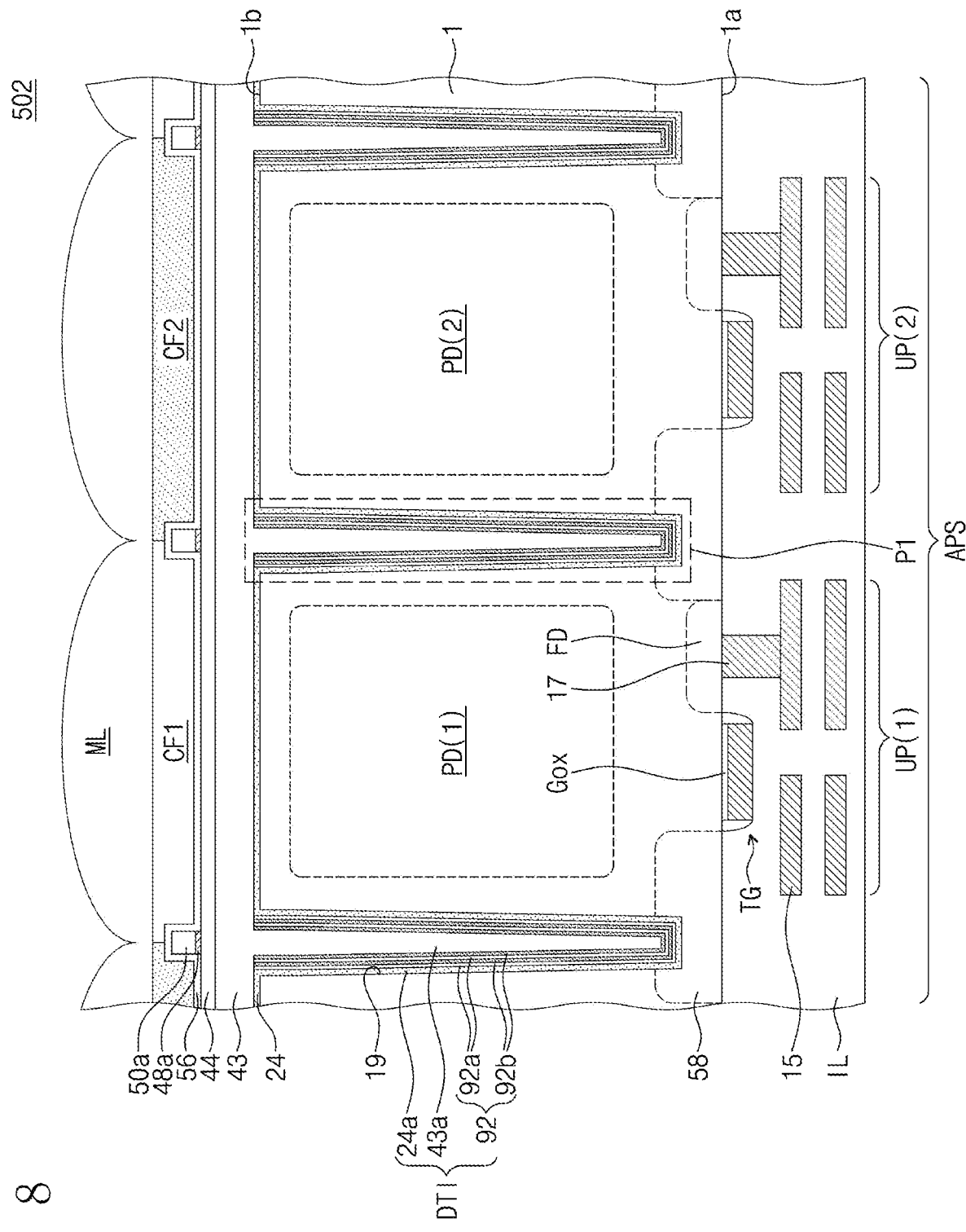
FIG. 8 illustrates a cross-sectional view showing an image sensor according to an exemplary embodiment of the present inventive concept.
Figure 9A:
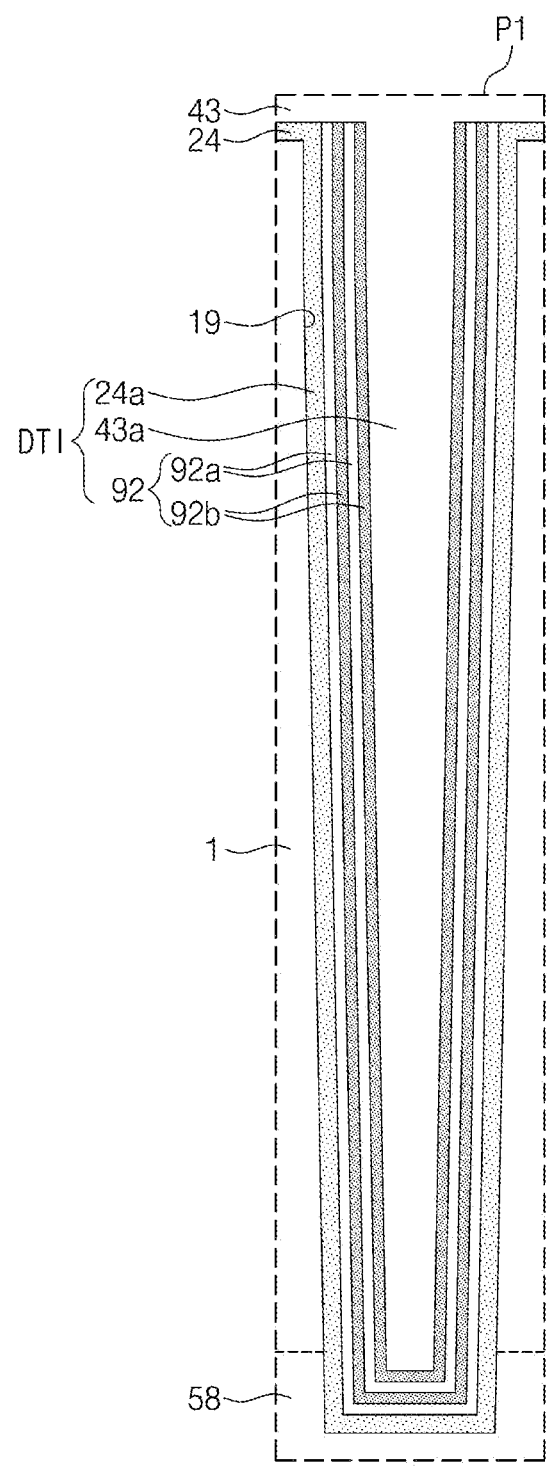
FIGS. 9A and 9B illustrate enlarged views showing section P1 of FIG. 8.
Figure 9B:
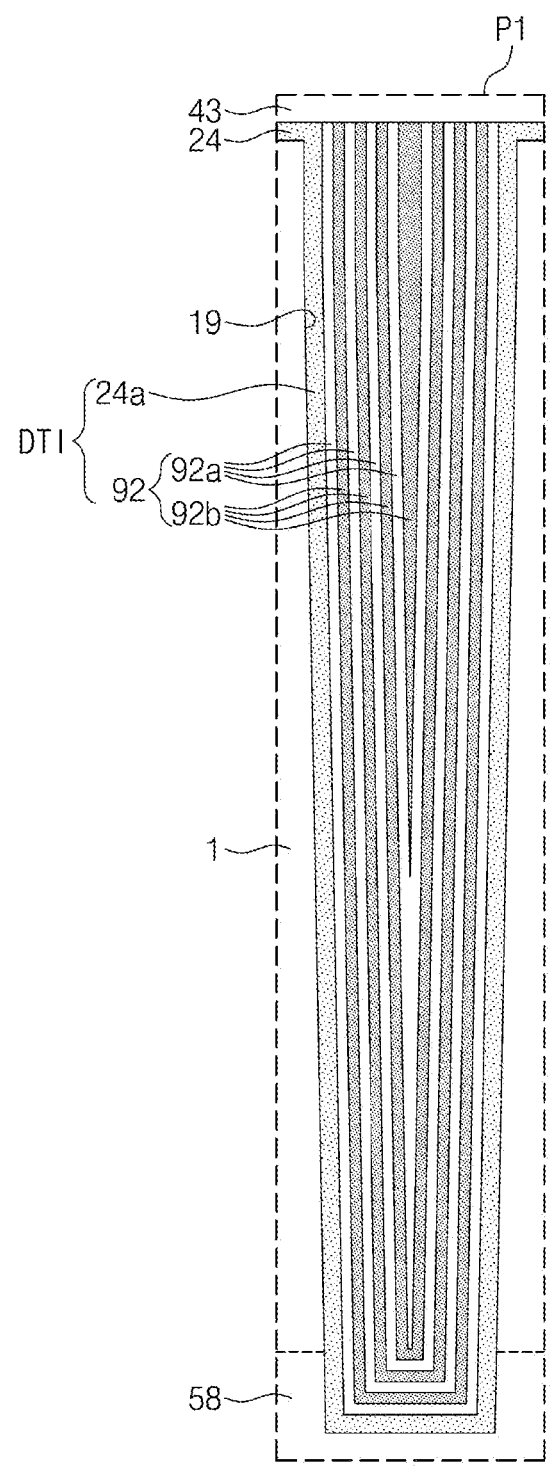

FIG. 8 illustrates a cross-sectional view showing an image sensor according to an exemplary embodiment of the present inventive concept. FIGS. 9A and 9B illustrate enlarged views showing section P1 of FIG. 8.

Referring to FIGS. 8 and 9A, an image sensor 502 according to the present embodiment may be configured such that the first substrate 1 may be provided therein with a device isolation region 58 adjacent to the first surface 1a of the first substrate 1. The device isolation region 58 may limit the active sections ACT of FIG. 3. The device isolation region 58 may be doped with impurities having the first conductivity type that is the same as that of the first substrate 1, and may have an impurity concentration greater than that of the first substrate 1. The impurities having the first conductivity type may be, for example, p-type boron. The first substrate 1 may have therein backside deep trenches 19 that are formed from the second surface 1b toward the first surface 1a. The second surface 1b may be in contact with the fixed charge layer 24. The fixed charge layer 24 may have a portion 24a that is inserted into the backside deep trenches 19. A reflective structure 92 may be disposed on the portion 24a of the fixed charge layer 24 in the backside deep trench 19.

The reflective structure 92 may include third reflective liners 92a and fourth reflective liners 92b that are alternately disposed in a direction toward an inside of the backside deep trench 19 from a lateral surface of the first substrate 1. The third reflective liners 92a may have a refractive index different from that of the fourth reflective liners 92b. The number of the third reflective liners 92a and of the fourth reflective liners 92b may be two to ten. The third reflective liners 92a may each include, for example, silicon oxide. The fourth reflective liners 92b may each include, for example, SiN, SiCN, SiOCN, or SiON.

On the second surface 1b, the fixed charge layer 24 may be covered with a planarized dielectric layer 43. The planarized dielectric layer 43 may include, for example, silicon oxide. The planarized dielectric layer 43 may have a portion 43a that is inserted into the backside deep trench 19 and is in contact with the reflective structure 92. The pixel separation part DTI may be constituted by the portion 24a of the fixed charge layer 24, the reflective structure 92, and the portion 43a of the planarized dielectric layer 43. The pixel separation part DTI may have a bottom surface that is inserted into the device isolation region 58. The bottom surface of the pixel separation part DTI may be spaced apart from the first surface 1a of the first substrate 1. The reflective structure 92 might not extend onto the second surface 1b. The reflective structure 92 may have a top surface substantially coplanar with that of the fixed charge layer 24. Other configurations may be identical or similar to those discussed above with reference to FIG. 4.

Referring to FIG. 9B, differently from FIG. 9A, the planarized dielectric layer 43 might not include the portion 43a inserted into the backside deep trench 19. The backside deep trench 19 may be filled with the reflective structure 92. Other structural features may be identical or similar to those discussed above.

Figure 10:
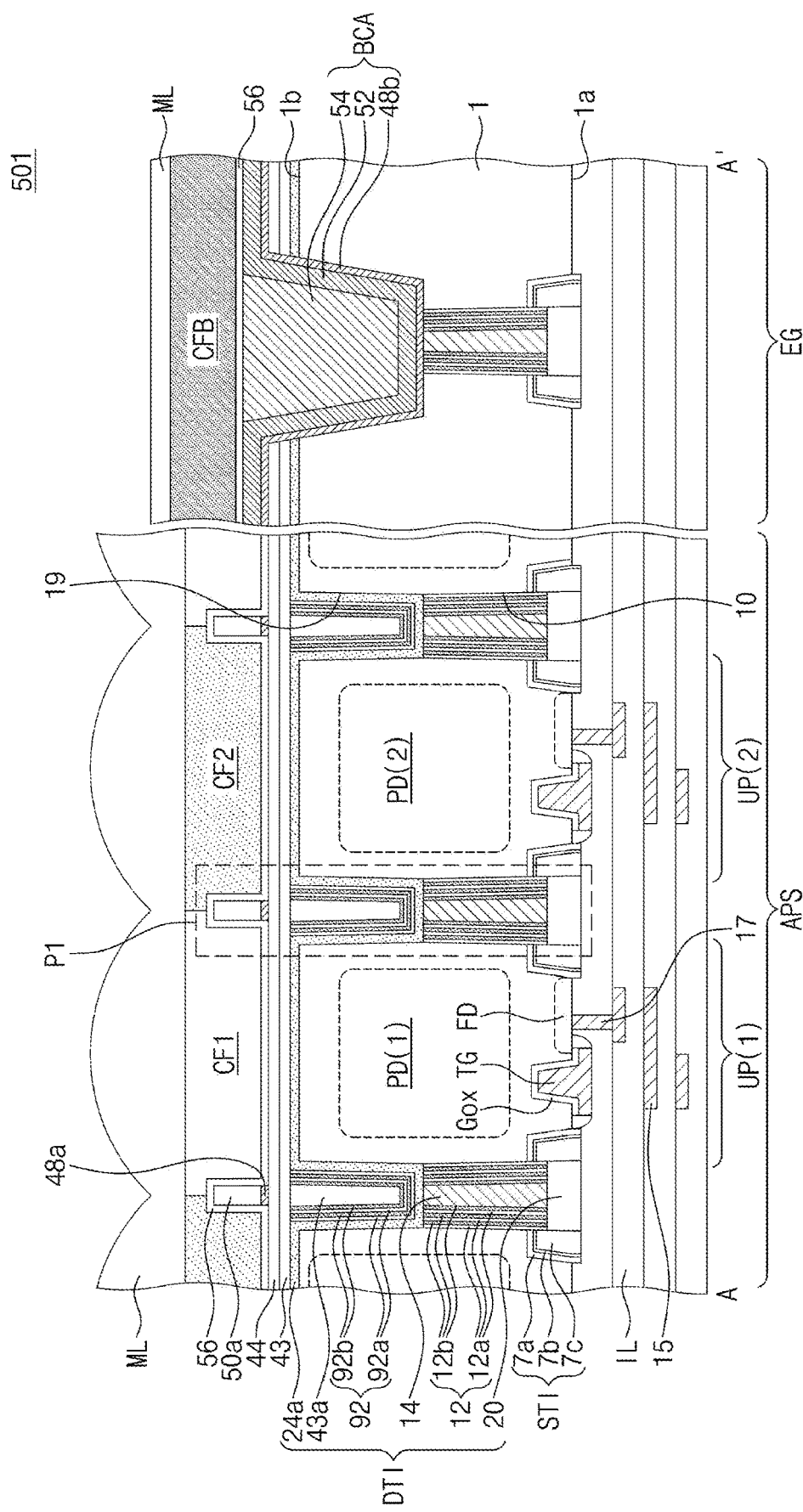
FIG. 10 illustrates a cross-sectional view taken along line A-A' of FIG. 3.
Figure 11A:
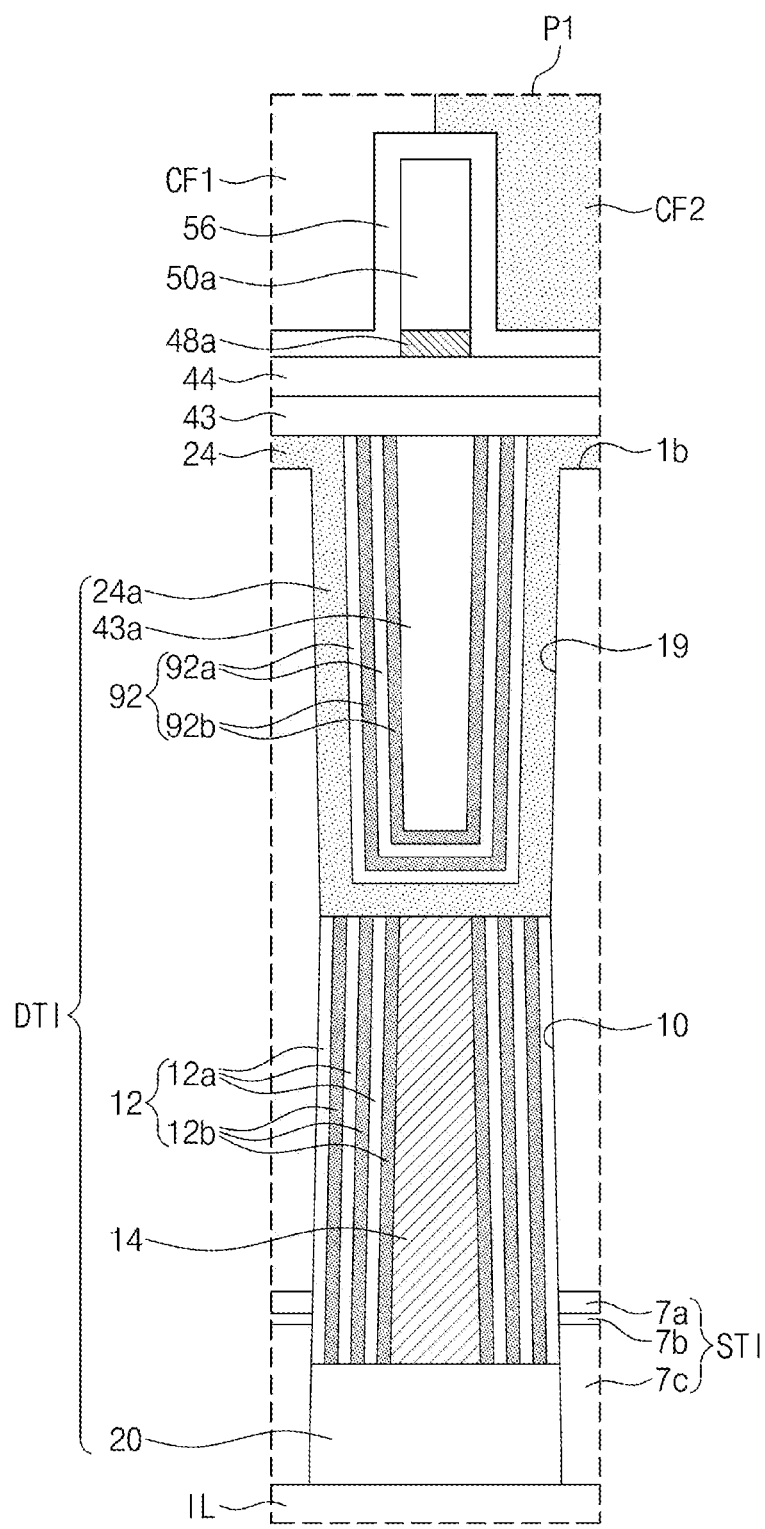
FIGS. 11A and 11B illustrate enlarged views showing section P1 of FIG. 10.
Figure 11B:
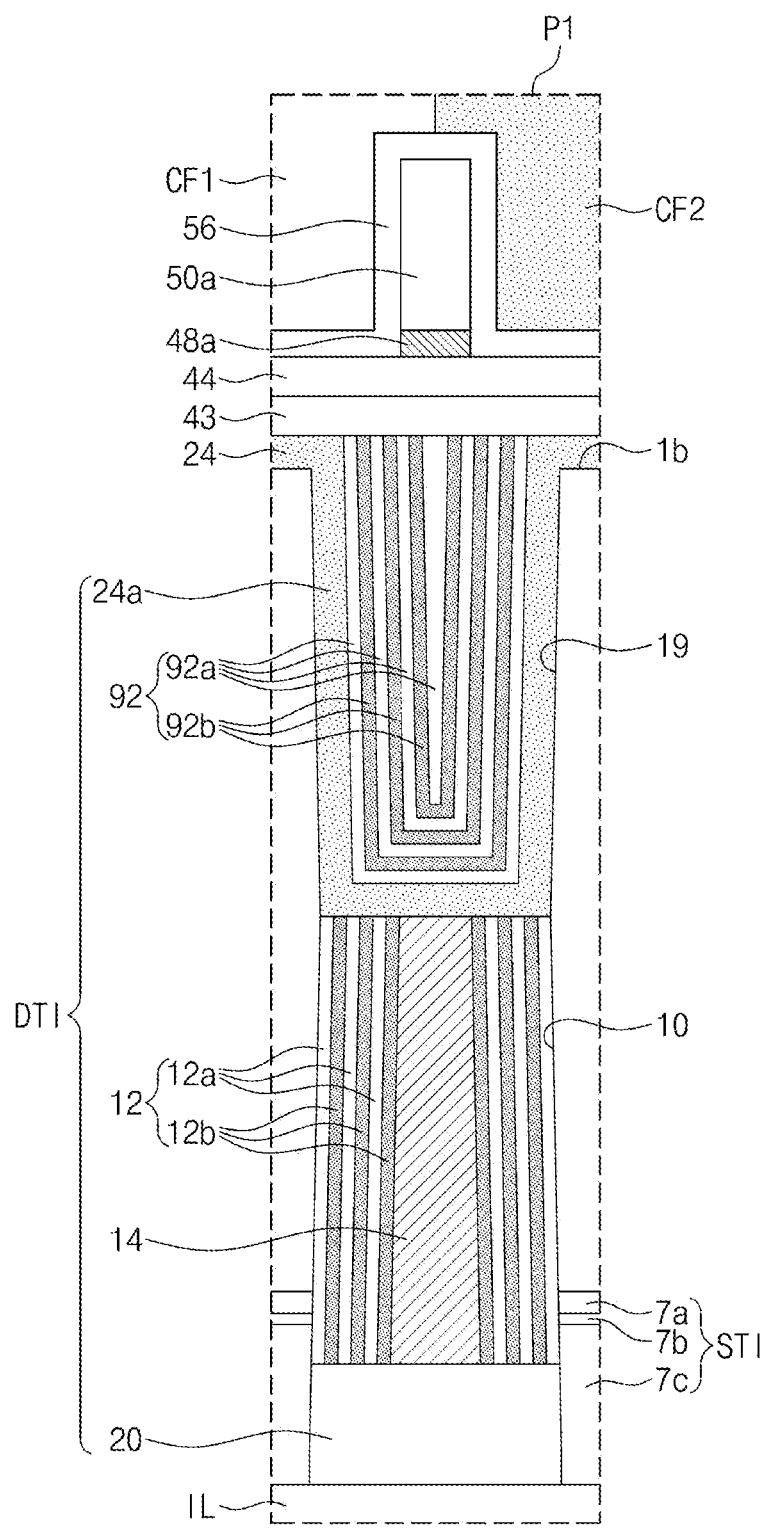

FIG. 10 illustrates a cross-sectional view taken along line A-A' of FIG. 3. FIGS. 11A and 11B illustrate enlarged views showing section P1 of FIG. 10.

Referring to FIGS. 10 and 11A, an image sensor 503 according to the present embodiment may be configured such that the first substrate 1 may have a front-side deep trench 10 and a backside deep trench 19 that are formed therein. The front-side deep trench 10 and the backside deep trench 19 may overlap each other. For example, at an interface between the front-side deep trench 10 and the backside deep trench 19, the width of the front-side deep trench 10 may be the same as that of the backside deep trench 19. The pixel separation part DTI may include a front-side buried pattern 20, a conductive structure 14, and a first reflective structure 12 that are disposed in the front-side deep trench 10, and may also include a portion 24a of the fixed charge layer 24, a portion 43a of the planarized dielectric layer 43, and a second reflective structure 92 that are disposed in the backside deep trench 19.

The first reflective structure 12 may include first reflective liners 12a and second reflective liners 12b that are alternately disposed in a direction toward the conductive structure 14 from a lateral surface of the first substrate 1. The first reflective liners 12a may have a refractive index different from that of the second reflective liners 12b. The number of the first reflective liners 12a and of the second reflective liners 12b may be about two to about ten. The reflective index of the second reflective liners 12b may be greater than that of the first reflective liners 12a. For example, the first reflective liners 12a may each include silicon oxide, and the second reflective liners 12b may each include SiN, SiCN, SiOCN, or SiON.

The second reflective structure 92 may include third reflective liners 92a and fourth reflective liners 92b that are alternately disposed in a direction toward an inside of the backside deep trench 19 from a lateral surface of the first substrate 1. For example, the third reflective liners 92a and fourth reflective liners 92b may be alternately disposed in a direction toward the portion 43a of the planarized dielectric layer 43. The third reflective liners 92a may have a refractive index different from that of the fourth reflective liners 92b. The number of the third reflective liners 92a and of the fourth reflective liners 92b may be two to ten. The third reflective liners 92a may each include, for example, silicon oxide. The fourth reflective liners 92b may each include, for example, SiN, SiCN, SiOCN, or SiON.

The fixed charge layer 24 may be interposed between the second reflective structure 92 and the first reflective structure 12 and between the second reflective structure 92 and the conductive structure 14. Other structural features may be identical or similar to those discussed above.

In addition, referring to FIG. 11B the second reflective structure 92 may fill the backside deep trench 19. The pixel separation part DTI may include a front-side buried pattern 20, a conductive structure 14, and a first reflective structure 2 that are disposed in the front-side deep trench 10, and may also include a portion 24a of the fixed charge layer 24 and a second reflective structure 92 that are disposed in the backside deep trench 19. Other structural features may be identical or similar to those discussed above.

Figure 12:
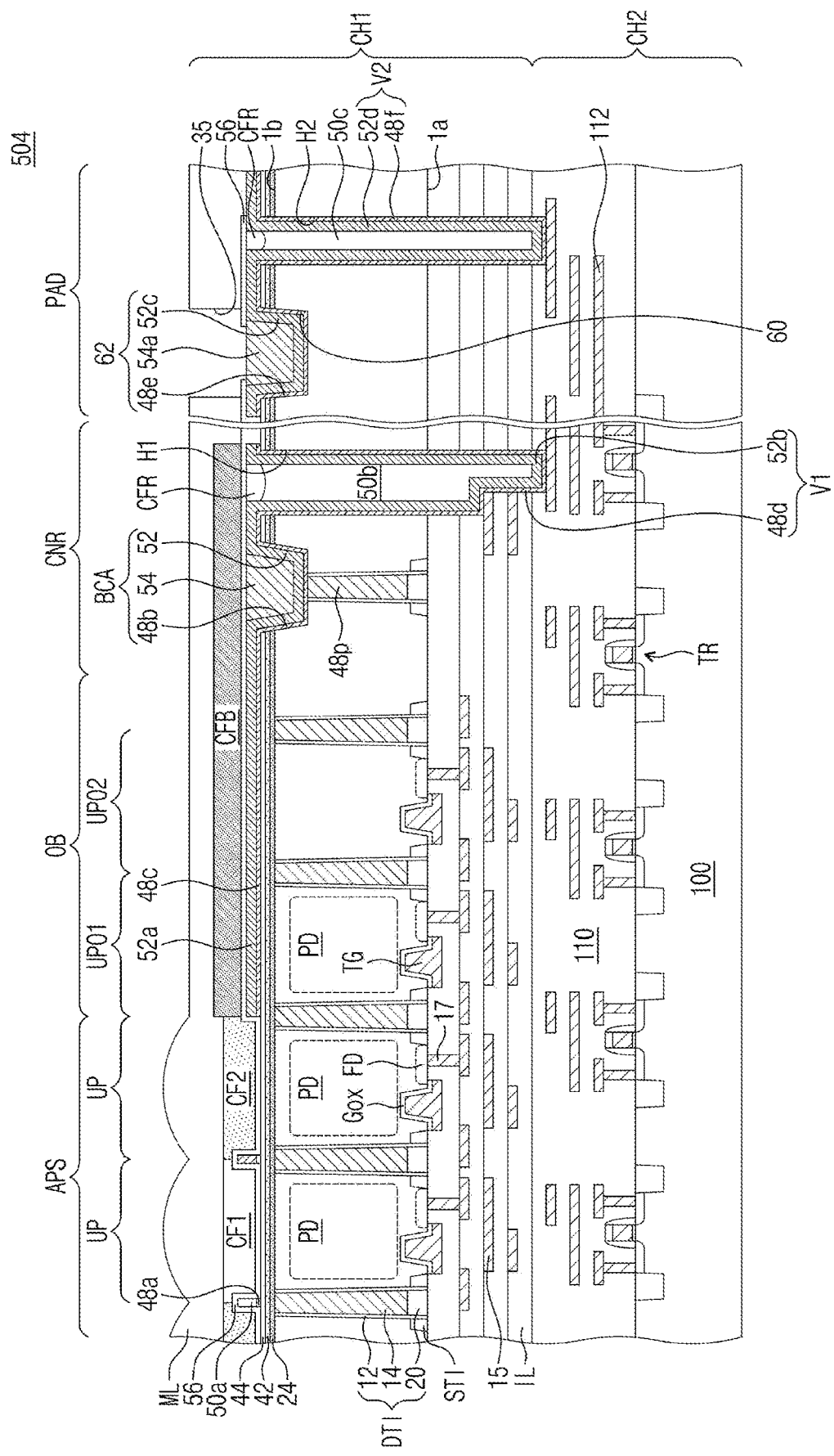
FIG. 12 illustrates a cross-sectional view showing an image sensor according to an exemplary embodiment of the present inventive concept.

FIG. 12 illustrates a cross-sectional view showing an image sensor according to an exemplary embodiment of the present inventive concept.

Referring to FIG. 12, an image sensor 504 according to the present embodiment may have a structure in which a first sub-chip CH1 and a second sub-chip CH2 are bonded to each other. The first sub-chip CH1 may have, for example, an image sensing function. The second sub-chip CH2 may include, for example, circuits for driving the first sub-chip CH1 or storing electric signals generated from the first sub-chip CH1.

The second sub-chip CH2 may include a second substrate 100, a plurality of transistors TR disposed on the second substrate 100, a second interlayer dielectric layer 110 that covers the second substrate 100, and second wiring lines 112 disposed in the second interlayer dielectric layer 110. The second interlayer dielectric layer 110 may have a single-layered or multi-layered structure including at least one of a silicon oxide layer, a silicon nitride layer, a silicon oxynitride layer, and a porous dielectric layer. The first sub-chip CH1 and the second sub-chip CH2 may be bonded to each other. Therefore, the first interlayer dielectric layer IL and the second interlayer dielectric layer 110 may be in contact with each other.

The first sub-chip CH1 may include a first substrate 1 including a pixel array area APS, an optical black area OB, a connection area CNR, and a pad area PAD. The first sub-chip CH1 on the pixel array area APS and a portion of the connection area CNR may have the same structure as that discussed above with reference to FIGS. 3 and 4A. For example, the pixel array area APS may include a plurality of unit pixels UP. On the pixel array area APS, the unit pixels UP may be divided from each other by a pixel separation part DTI disposed in the first substrate 1. The first substrate 1 may be provided therein with a shallow device isolation part STI adjacent to a first surface 1a thereof. The pixel separation part DTI may penetrate the shallow device isolation part STI. On each of the unit pixels UP, a photoelectric conversion element PD may be disposed in the first substrate 1. On each unit pixel UP, a transfer gate TG may be disposed on the first surface 1a of the first substrate 1. A floating diffusion region FD may be disposed in the first substrate 1 on one side of the transfer gate TG. The first surface 1a may be covered with first interlayer dielectric layers IL.

The pixel separation part DTI may have one of the structures discussed in FIGS. 5A to 5E, 9A, 9B, 11A, and 11B.

On the optical black area OB, no light may be incident into the first substrate 1. The pixel separation part DTI may extend onto the optical black area OB to separate a first black pixel UPO1 and a second black pixel UPO2 from each other. On the first black pixel UPO1, a photoelectric conversion element PD may be disposed in the first substrate 1. On the second black pixel UPO2, the photoelectric conversion element PD might not be disposed in the first substrate 1. A transfer gate TO and a floating diffusion region FD may be disposed on each of the first black pixel UPO1 and the second black pixel UPO2. The first black pixel UPO1 may provide a first reference amount of charge by detecting an amount of charge possibly generated from the photoelectric conversion element PD in a state where light is interrupted. The first reference amount of charge may become a relative reference value when calculating an amount of charge generated from the unit pixels UP. The second black pixel UPO2 may provide a second reference amount of charge by detecting an amount of charge possibly generated in a state where the photoelectric conversion element PD is absent. The second reference amount of charge may be used as information that eliminates process noise.

A first fixed charge layer 24, a second fixed charge layer 42, a first protection layer 44, may be disposed on a second surface 1b of the first substrate 1 on the optical black area OB, the connection area CNR, and the pad area. PAD. The edge area EG discussed with reference to FIGS. 3 and 4 may correspond to a portion of the connection area CNR of FIG. 12.

Referring to FIGS. 4 and 12, on the connection area CNR, a connection contact BCA may penetrate the first fixed charged layer 24, the first protection layer 44, the second fixed charge layer 42, and a portion of the first substrate 1, thereby being in contact with the conductive structure 14 of the pixel separation part DTI. The connection contact BCA may be positioned in a first trench 46. The connection contact BCA may include a diffusion stop pattern 48b that conformally covers an inner sidewall and a bottom surface of the first trench 46, a first metal pattern 52 disposed on the diffusion stop pattern 48b, and a second metal pattern 54 that fills the first trench 46.

A portion of the first diffusion stop pattern 48b may extend on the first protection layer 44 on the optical black area OB to provide a first optical black pattern 48c. A portion of the first metal pattern 52 may extend on the first optical black pattern 48c on the optical black area OB to provide a second optical black pattern 52a. The second optical black pattern 52a and the connection contact BCA may be covered with a second protection layer 56. On the optical black area OB and the connection area CNR, a third optical black pattern CFB may be positioned on the second protection layer 56.

On the connection area CNR, a first via V1 may be disposed adjacent to a side of the connection contact BCA. The first via V1 may be called a back bias stack via. The first via V1 may penetrate the first protection layer 44, the second fixed charge layer 42, the first fixed charge layer 24, the first substrate 1, the first interlayer dielectric layers IL, and a portion of the second interlayer dielectric layer 110, thereby being simultaneously in contact with one of the first wiring lines 15 and one of second wiring lines 112.

The first via V1 may be disposed in a first via hole H1. The first via V1 may include a second diffusion stop pattern 48d and a first via, pattern 52b disposed on the second diffusion stop pattern 48d. The second diffusion stop pattern 48d may be connected to the first diffusion stop pattern 48b. The first via pattern 52b may be connected to the first metal pattern 52. The connection contact BCA may be connected through the first via 1 to one of the first wiring lines 15 and one of the second wiring lines 112.

The second diffusion stop pattern 48d and the first via pattern 52b may each conformally cover an inner wall of the first via hole H1. Neither the second diffusion stop pattern 48d nor the first via pattern 52b may completely fill the first via hole H1. A first low-refractive residual layer 50b may be disposed in the first via hole H1. For example, the first low-refractive residual layer 50b may fill a remaining space of the first via hole H1. A color filter residual layer CFR may be disposed on the first low-refractive residual layer 50b.

On the pad area PAD, there may be disposed an external connection pad 62 and a second via V2 that are connected to each other. The external connection pad 62 may penetrate the first protection layer 44, the second fixed charge layer 42, the first fixed charge layer 24, and a portion of the first substrate 1. The external connection pad 62 may be disposed in a fourth trench 60. The external connection pad 62 may include a third diffusion stop pattern 48e and a first pad pattern 52c that conformally cover an inner sidewall and a bottom surface of the fourth trench 60 and are sequentially disposed in the fourth trench 60. The external connection pad 62 may also include a second pad pattern 54a that fills a remaining area of the fourth trench 60.

The second via V2 may penetrate the first protection layer 44, the second fixed charge layer 42, the first fixed charge layer 24, the first substrate 1, the first interlayer dielectric layers IL, and a portion of the second interlayer dielectric layer 110, thereby being in contact with one of the second wiring lines 112. The external connection pad 62 may be connected through the second via V2 to one of the second wiring lines 112. The second via V2 may be disposed in a second via hole H2. The second via V2 may include a fourth diffusion stop pattern 48f and a second via pattern 52d that conformally cover an inner sidewall and a bottom surface of the second via hole H2 and are sequentially disposed in the second via hole H2. Neither the fourth diffusion stop pattern 48f nor the second via, pattern 52d may completely fill the second via hole H2. A second low-refractive residual layer 50c may fill a remaining space of the second via hole H2. The color filter residual layer CFR may be disposed on the second low-refractive residual layer 50c.

The light-shield pattern 18a, the first diffusion stop pattern 48b, the first optical black pattern 48c, and the second to fourth diffusion stop patterns 48d to 48f may have the same thickness and material (e.g., titanium) as each other. The first metal pattern 52, the second optical black pattern 52a, the first via pattern 52b, the first pad pattern 52c, and the second via pattern 52d may have the same thickness and material (e.g., tungsten) as each other. The second metal pattern 54 and the second pad pattern 54a may have the same material (e.g., aluminum) as each other.

The low-refractive pattern 50a, the first low-refractive residual layer 50b, and the second low-refractive residual layer 50c may have the same material as each other. The color filter residual layer CFR may have the same color and material as that of one of the color filters CF1 or CF2.

The second protection layer 56 may have an opening that overlaps the pad area PAD and exposes the second pad pattern 54a. The microlens array layer ML may extend onto the optical black area OB, the connection area CNR, and the pad area PAD. On the pad area PAD, the microlens array layer ML may have an opening 35 that exposes the second pad pattern 54a.

Figure 13:
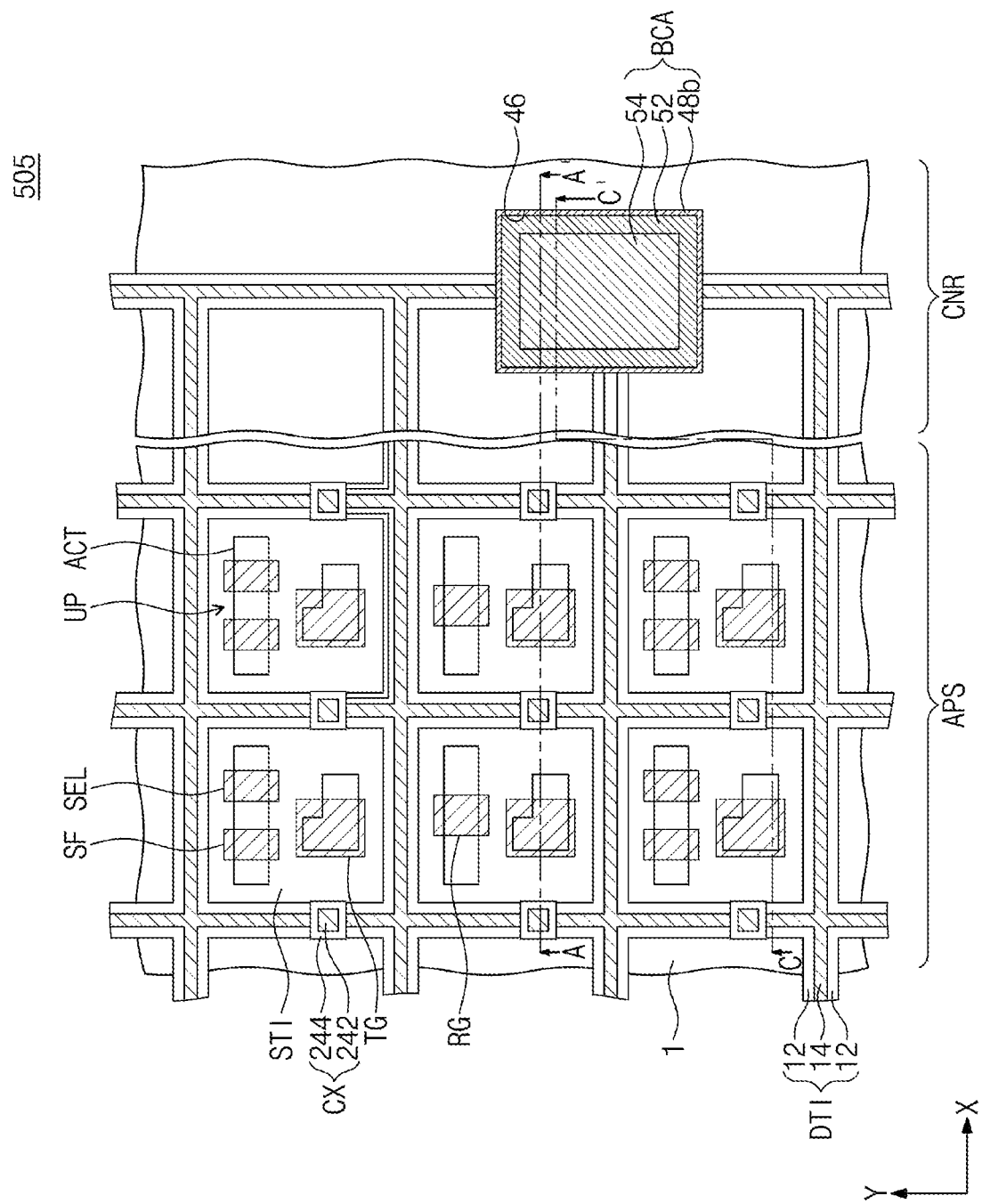
FIG. 13 illustrates a plan view showing a semiconductor device according to an exemplary embodiment of the present inventive concept.
Figure 14:
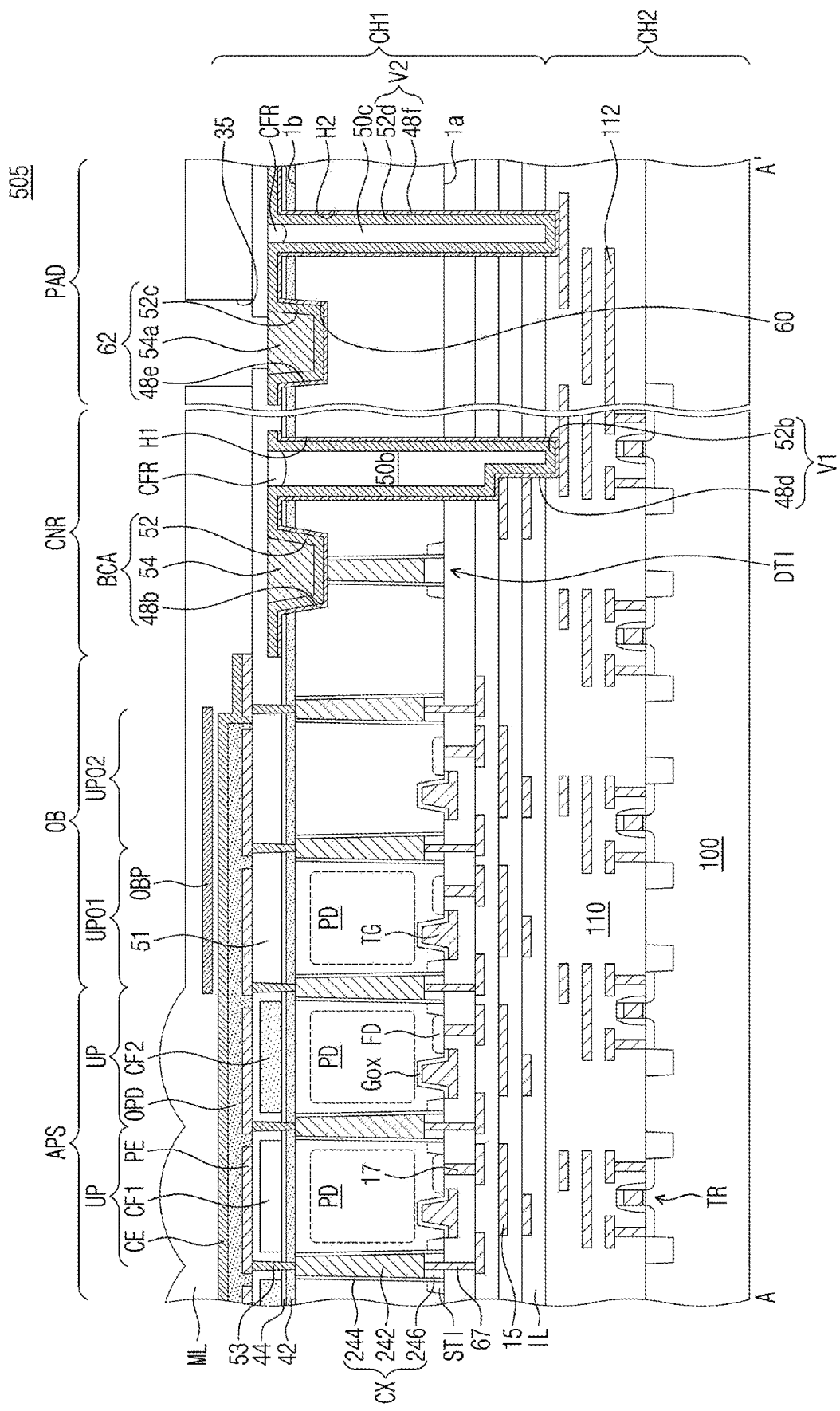
FIG. 14 illustrates a cross-sectional view taken along line A-A' of FIG. 13.

FIG. 13 illustrates a plan view showing a semiconductor device according to an exemplary embodiment of the present inventive concept. FIG. 14 illustrates a cross-sectional view taken along line A-A' of FIG. 13. FIG. 13 omits illustration of an optical black area, a pad area, and a portion of a connection area. A cross section taken along line C-C' of FIG. 13 may include the pixel separation part DTI of FIG. 4 instead of a through contact structure CX of FIG. 14. The cross section taken along line C-C' of FIG. 13 may be the same as or similar to that of FIG. 4.

Referring to FIGS. 4, 13, and 14, an image sensor 505 according to the present embodiment may be an example of organic CMOS image sensors. As shown in the plan view of FIG. 13, each unit pixel UP may be provided on its one side with a through contact structure CX that penetrate the pixel separation part DTI. The through contact structure CX may include a contact pattern 242 directed from the first surface toward the second surface 1b, a contact dielectric layer 244 that at least partially surrounds the contact pattern 242, and a third front-side buried pattern 246 between the contact pattern 242 and one of the first interlayer dielectric layers IL that is most adjacent to the first surface 1a. The contact pattern 242 may include a conductive material. The contact pattern 242 may be insulated from the conductive structure 14 of the pixel separation part DTI.

A second contact plug 67 may penetrate the third front-side buried pattern 246 and one of the first interlayer dielectric layers IL that is most adjacent to the first surface 1a, thereby being in contact with the contact pattern 242. The second contact plug 67 may be connected to one of the first wiring lines 15. Each of the color filters CF1 and CF2 may have one of blue or red colors. A planarized layer 51 may cover the color filters CF1 and CF2. The planarized layer 51 may include, for example, one or more of silicon oxide and PETEOS. On the pixel array area APS and the optical black area OB, the planarized layer 51 may be provided thereon with pixel electrodes PE that are spaced apart from each other. The pixel electrodes PE may overlap corresponding unit pixels UP, UPO1, and UPO2. A third contact plug 53 may penetrate the planarized layer 51 to electrically connect the pixel electrodes PE to the through contact structure CX.

The pixel electrodes PE may be covered with an organic photoelectric conversion layer OPD. The organic photoelectric conversion layer OPD may include a p-type organic semiconductor material and an n-type organic semiconductor material, and the p-type and n-type organic semiconductor materials may form a p-n junction. In addition, the organic photoelectric conversion layer OPD may include quantum dots or chalcogenide. The organic photoelectric conversion layer OPD may perform a photoelectric conversion operation with respect to light having a specific color (e.g., green). A common electrode CE may be disposed on the organic photoelectric conversion layer OPD. The pixel electrodes PE and the common electrode CE may include one or more of indium tin oxide (ITO), indium zinc oxide (IM), zinc oxide (ZnO), and/or an organic transparent conductive material.

The microlens array layer ML may be disposed on the common electrode CE. On the optical black area OB, an optical black pattern OBP may be disposed in the microlens array layer ML. The optical black pattern OBP may include, for example, an opaque metal (e.g., aluminum). Other configurations may be identical or similar to those discussed with reference to FIGS. 4 and 12. As the image sensor 505 according to the present embodiment includes the organic photoelectric conversion layer OPD, a single unit pixel UP may concurrently detect light having two colors.

For an image sensor according to the present inventive concept, a pixel separation part may include a reflective structure to suppress crosstalk between neighboring unit pixels. Thus, optical efficiency may increase to increase optical sensitivity. The reflective structure according to an exemplary embodiment of the present inventive concept may include second reflective liners whose dielectric constant is less than that of first reflective liners of the reflective structure, and as a result, dark current characteristic may be improved. Accordingly, the image sensor may produce an image with increased quality and increased sharpness.

In a method of fabricating an image sensor according to an exemplary embodiment of the present inventive concept, a pixel separation part may be formed to improve modulation transfer function, dark current, and crosstalk, and an image sensor having the pixel separation part may be stably formed at high yields without process failure.

It is to be understood that the exemplary embodiments of the present inventive concept discussed above may be combined with each other.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. An image sensor, comprising:
   a substrate including a first surface and a second surface that are opposite to each other;
   an interlayer dielectric layer covering the first surface; and
   a pixel separation part disposed in the substrate, wherein the pixel separation part divides a plurality of unit pixels from each other,
   wherein the pixel separation part includes:
      a conductive structure that extends from the first surface of the substrate toward the second surface of the substrate;
      a first reflective structure disposed between the conductive structure and the substrate; and
      a front-side buried pattern disposed between the conductive structure and the interlayer dielectric layer and between the first reflective structure and the interlayer dielectric layer,
   wherein the first reflective structure includes a plurality of first reflective liners and a plurality of second reflective liners that are alternately disposed in a direction toward the conductive structure from a lateral surface of the substrate,
   wherein a refractive index of the first reflective liners is different from a refractive index of the second reflective liners.

2. The image sensor of claim 1, wherein
   an outermost one of the first reflective liners covers the substrate,
   an innermost one of the second reflective liners covers the conductive structure,
   each of the first reflective liners includes silicon oxide, and
   the second reflective liners each include SiN, SiCN, SiOCN, or SiON.

3. The image sensor of claim 1, further comprising a device isolation part adjacent to the first surface of the substrate, wherein the device isolation part is in contact with a lateral surface of the front-side buried pattern and a sidewall of the first reflective structure.

4. The image sensor of claim 3, wherein
   the device isolation part is disposed in a first trench in the first surface of the substrate,
   the device isolation part includes a first device liner, a second device liner, and a device buried pattern that cover an inner sidewall of the first trench, and
   the first device liner, the second device liner, and the device buried pattern are in contact with a sidewall of an outermost one of the first reflective liners.

5. The image sensor of claim 1, further comprising a fixed charge layer that covers the second surface,
   wherein the fixed charge layer is in contact with the first and second reflective liners and the conductive structure.

6. The image sensor of claim 1, wherein
   the substrate includes an edge area spaced apart from the unit pixels,
   the pixel separation part is disposed in the edge area, and
   the image sensor further comprises a connection contact on the edge area,
   wherein the connection contact penetrates the substrate and contacts the first reflective structure and the conductive structure.

7. The image sensor of claim 1, wherein the pixel separation part further includes:
a second reflective structure that extends from the second surface of the substrate toward the first surface of the substrate, wherein the second reflective structure is adjacent to the first reflective structure and the conductive structure; and
a fixed charge layer that covers the second surface, wherein the fixed charge layer is disposed between the substrate and the second reflective structure, between the second reflective structure and the first reflective structure, and between the second reflective structure and the conductive structure,
wherein the second reflective structure includes a plurality of third reflective liners and a plurality of fourth reflective liners that are alternately disposed.

8. The image sensor of claim 7, further comprising a planarized dielectric layer that covers the fixed charge layer on the second surface of the substrate and extends into the substrate and contacts the second reflective structure.

9. The image sensor of claim 1, further comprising:
a fixed charge layer that covers the second surface of the substrate;
a color filter disposed on the fixed charge layer; and
a microlens disposed on the color filter,
wherein at least one trench is in the second surface of the substrate, and
wherein the fixed charge layer covers an inner sidewall and a bottom surface of the at least one trench.

10. An image sensor, comprising:
a substrate including a first surface and a second surface that are opposite to each other, wherein the substrate includes a plurality of unit pixels;
a pixel separation part disposed in the substrate, wherein the pixel separation part divides the unit pixels from each other;
a device isolation part adjacent to the first surface of the substrate and limiting an active section;
a plurality of photoelectric co version elements disposed in the substrate and on corresponding unit pixels;
a transfer gate disposed on the first surface of the substrate and on each of the unit pixels;
a fixed charge layer disposed on the second surface of the substrate;
a color filter array disposed on the fixed charge layer; and
a microlens array disposed on the color filter array,
wherein the pixel separation part includes:
a conductive structure extending from the first surface of the substrate toward the second surface of the substrate;
a first reflective structure disposed between the conductive structure and the substrate; and
a front-side buried pattern disposed on the conductive structure and the first reflective structure,
wherein the first reflective structure includes a plurality of first reflective liners and a plurality of second reflective liners that are alternately disposed in a direction toward the conductive structure from a lateral surface of the substrate,
wherein a dielectric constant of the second reflective liners is greater than a dielectric constant of the first reflective liners,
wherein the number of the first reflective liners is two to ten, and
wherein the number of the second reflective liners is two to ten.

11. The image sensor of claim 10, wherein a refractive index of the first reflective liners is different from a refractive index of the second reflective liners.

12. The image sensor of claim 10, wherein the device isolation part is in contact with a lateral surface of the front-side buried pattern and a sidewall of the first reflective structure.

13. The image sensor of claim 10, wherein
an outermost one of the first reflective liners is in contact with the substrate,
an innermost one of the second reflective liners is in contact with the conductive structure,
each of the first reflective liners includes silicon oxide, and the second reflective liners each include SiN, SiCN, SiOCN, or SiON.

14. The image sensor of claim 10, wherein the device isolation part includes a first device liner, a second device liner, and a device buried pattern that cover a sidewall of the substrate,
wherein the first device liner, the second device liner, and the device buried pattern are in contact with an outermost one of the first reflective liners.

15. The image sensor of claim 10, wherein
the substrate further includes an edge area spaced apart from the unit pixels,
the pixel separation part is disposed in the edge area, and
the image sensor further comprises a connection contact on the edge area,
wherein the connection contact penetrates the substrate and contacts the first reflective structure and the conductive structure.

16. An image sensor, comprising:
a substrate including a first surface and a second surface that are opposite to each other, wherein the substrate includes a trench that separates a plurality of unit pixels from each other and extends toward the first surface from the second surface; and
a pixel separation part disposed in the trench,
wherein the pixel separation part includes:
a fixed charge layer disposed on the second surface of the substrate and disposed in the trench; and
a first reflective structure covering the fixed charge layer in the trench,
wherein the first reflective structure includes a first reflective liner and a second reflective liner that are alternately disposed in a direction toward an inside of the trench from a lateral surface of the substrate,
wherein a refractive index of the first reflective liner is different from a refractive index of the second reflective liner.

17. The image sensor of claim 16, further comprising a planarized layer covering the fixed charge layer and disposed on the second surface of the substrate, wherein the planarized layer is inserted into the trench and contacts the first reflective structure.

18. The image sensor of claim 16, wherein the first reflective structure fills at least a portion of the trench.

19. The image sensor of claim 16, further comprising:
a conductive structure that extends from the first surface of the substrate toward the second surface of the substrate; and
a second reflective structure disposed between the conductive structure and the substrate,
wherein the second reflective structure includes a plurality of third reflective liners and a plurality of fourth reflective liners that are alternately disposed in a direction toward the conductive structure from the lateral surface of the substrate,
wherein a refractive index of the third reflective liners is different from a refractive index of the fourth reflective liners.

20. The image sensor of claim 19, wherein the fixed charge layer is disposed between the first reflective structure and the second reflective structure.

* * * * *